(12) United States Patent
Gudlavalleti et al.

(10) Patent No.: US 8,164,821 B2
(45) Date of Patent: Apr. 24, 2012

(54) MICROELECTROMECHANICAL DEVICE WITH THERMAL EXPANSION BALANCING LAYER OR STIFFENING LAYER

(75) Inventors: Sauri Gudlavalleti, San Jose, CA (US); Clarence Chui, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 1098 days.

(21) Appl. No.: 12/072,090

(22) Filed: Feb. 22, 2008

(65) Prior Publication Data
US 2009/0231666 A1   Sep. 17, 2009

(51) Int. Cl.
G02B 26/00   (2006.01)
(52) U.S. Cl. ........................................ 359/292
(58) Field of Classification Search .............. 359/292, 359/291, 293, 295, 260, 237, 220, 223, 224
See application file for complete search history.

(56) References Cited

U.S. PATENT DOCUMENTS

| | | |
|---|---|---|
| 2,590,906 A | 4/1952 | Tripp |
| 2,677,714 A | 5/1954 | Auwarter |
| 3,247,392 A | 4/1966 | Thelen |
| 3,679,313 A | 7/1972 | Rosenberg |
| 3,728,030 A | 4/1973 | Hawes |
| 3,886,310 A | 5/1975 | Guldberg |
| 3,955,190 A | 5/1976 | Teraishi |
| 4,403,248 A | 9/1983 | te Velde |
| 4,421,381 A | 12/1983 | Ueda et al. |
| 4,441,789 A | 4/1984 | Pohlack |
| 4,441,791 A | 4/1984 | Hornbeck |
| 4,497,974 A | 2/1985 | Deckman et al. |
| 4,498,953 A | 2/1985 | Cook et al. |
| 4,560,435 A | 12/1985 | Brown et al. |
| 4,655,554 A | 4/1987 | Armitage |
| 4,705,361 A | 11/1987 | Frazier et al. |
| 4,779,959 A | 10/1988 | Saunders |
| 4,786,128 A | 11/1988 | Birnbach |
| 4,822,993 A | 4/1989 | Dillon et al. |
| 4,859,060 A | 8/1989 | Katagiri et al. |
| 4,925,259 A | 5/1990 | Emmett |

(Continued)

FOREIGN PATENT DOCUMENTS
DE   10 2006 039 071   2/2008
(Continued)

OTHER PUBLICATIONS

Pape et al., Characteristics of the deformable mirror device for optical information processing, Optical Engineering, 22(6):676-681, Nov.-Dec. 1983.

(Continued)

*Primary Examiner* — Ricky Mack
*Assistant Examiner* — Tuyen Tra
(74) *Attorney, Agent, or Firm* — Knobbe, Martens, Olson & Bear LLP

(57) ABSTRACT

An interferometric modulating device is provided with a thermal expansion balancing layer on a side of the movable flexible layer opposite the movable reflector such that when temperature changes the distance between the movable reflector and the optical stack does not change significantly, thereby leading to stable color. Additionally, an interferometric modulating device is provided with a stiffening layer between the movable flexible layer and the movable reflector and at least one hollow void exists on the surface where the movable reflector and the stiffening layer contact each other so that the movable reflector is more rigid to bending, thereby reducing the temperature sensitivity of the movable reflector.

18 Claims, 20 Drawing Sheets
(7 of 20 Drawing Sheet(s) Filed in Color)

U.S. PATENT DOCUMENTS

| | | |
|---|---|---|
| 4,954,789 A | 9/1990 | Sampsell |
| 4,956,619 A | 9/1990 | Hornbeck |
| 4,973,131 A | 11/1990 | Carnes |
| 4,982,184 A | 1/1991 | Kirkwood |
| 5,022,745 A | 6/1991 | Zahowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,170,283 A | 12/1992 | O'Brien et al. |
| 5,315,370 A | 5/1994 | Bulow |
| 5,381,232 A | 1/1995 | Van Wijk |
| 5,452,138 A | 9/1995 | Mignardi et al. |
| 5,471,341 A | 11/1995 | Warde et al. |
| 5,526,172 A | 6/1996 | Kanack |
| 5,550,373 A | 8/1996 | Cole et al. |
| 5,559,358 A | 9/1996 | Burns et al. |
| 5,561,523 A | 10/1996 | Blomberg et al. |
| 5,597,736 A | 1/1997 | Sampsell |
| 5,600,383 A | 2/1997 | Hornbeck |
| 5,636,052 A | 6/1997 | Arney et al. |
| 5,646,729 A | 7/1997 | Koskinen et al. |
| 5,646,768 A | 7/1997 | Kaeriyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goosen |
| 5,719,068 A | 2/1998 | Suzawa et al. |
| 5,734,177 A | 3/1998 | Sakamoto |
| 5,771,116 A | 6/1998 | Miller et al. |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,838,484 A | 11/1998 | Goossen et al. |
| 5,867,302 A | 2/1999 | Fleming |
| 5,870,221 A | 2/1999 | Goossen |
| 5,914,804 A | 6/1999 | Goossen |
| 5,920,418 A | 7/1999 | Shiono et al. |
| 5,961,848 A | 10/1999 | Jacquet et al. |
| 6,028,689 A | 2/2000 | Michalicek et al. |
| 6,031,653 A | 2/2000 | Wang |
| 6,040,937 A | 3/2000 | Miles |
| 6,046,659 A | 4/2000 | Loo et al. |
| 6,055,090 A | 4/2000 | Miles |
| 6,100,861 A | 8/2000 | Cohen et al. |
| 6,124,851 A | 9/2000 | Jacobsen |
| 6,242,932 B1 | 6/2001 | Hembree |
| 6,262,697 B1 | 7/2001 | Stephenson |
| 6,301,000 B1 | 10/2001 | Johnson |
| 6,323,987 B1 | 11/2001 | Rinaudo et al. |
| 6,327,071 B1 | 12/2001 | Kimura |
| 6,335,235 B1 | 1/2002 | Bhakta et al. |
| 6,351,329 B1 | 2/2002 | Greywall |
| 6,356,378 B1 | 3/2002 | Huibers |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,433,917 B1 | 8/2002 | Mei et al. |
| 6,437,583 B1 | 8/2002 | Tartagni et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,519,073 B1 | 2/2003 | Goossen |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles et al. |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,768,555 B2 | 7/2004 | Chen |
| 6,794,119 B2 | 9/2004 | Miles |
| 6,813,059 B2 | 11/2004 | Hunter et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,960,305 B2 | 11/2005 | Doan et al. |
| 6,980,350 B2 | 12/2005 | Hung et al. |
| 6,982,820 B2 | 1/2006 | Tsai |
| 7,002,726 B2 | 2/2006 | Patel et al. |
| 7,006,272 B2 | 2/2006 | Tsai |
| 7,009,754 B2 | 3/2006 | Huibers |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,072,093 B2 | 7/2006 | Piehl et al. |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |
| 7,184,202 B2 | 2/2007 | Miles et al. |
| 7,198,973 B2 | 4/2007 | Lin et al. |
| 7,221,495 B2 | 5/2007 | Miles et al. |
| 7,236,284 B2 | 6/2007 | Miles |
| 7,245,285 B2 | 7/2007 | Yeh et al. |
| 7,289,259 B2 | 10/2007 | Chui et al. |
| 7,321,456 B2 | 1/2008 | Cummings |
| 7,321,457 B2 | 1/2008 | Heald |
| 7,327,510 B2 | 2/2008 | Cummings et al. |
| 7,372,613 B2 | 5/2008 | Chui et al. |
| 7,372,619 B2 | 5/2008 | Miles |
| 7,385,744 B2 | 6/2008 | Kogut et al. |
| 7,385,762 B2 | 6/2008 | Cummings |
| 7,400,488 B2 | 7/2008 | Lynch et al. |
| 7,405,852 B2 | 7/2008 | Brosnihan et al. |
| 7,417,746 B2 | 8/2008 | Lin et al. |
| 7,436,573 B2 | 10/2008 | Doan et al. |
| 7,459,402 B2 | 12/2008 | Doan et al. |
| 7,477,440 B1 | 1/2009 | Huang et al. |
| 7,508,566 B2 | 3/2009 | Feenstra et al. |
| 7,535,621 B2 | 5/2009 | Chiang |
| 7,561,321 B2 | 7/2009 | Heald |
| 7,566,664 B2 | 7/2009 | Yan et al. |
| 7,567,373 B2 | 7/2009 | Chui et al. |
| 7,569,488 B2 | 8/2009 | Rafanan |
| 7,629,197 B2 | 12/2009 | Luo et al. |
| 7,782,523 B2 | 8/2010 | Ishii |
| 7,813,029 B2 | 10/2010 | Kothari et al. |
| 7,848,003 B2 | 12/2010 | Kothari et al. |
| 7,852,544 B2 | 12/2010 | Sampsell |
| 7,898,722 B2 | 3/2011 | Miles |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2002/0024711 A1 | 2/2002 | Miles |
| 2002/0054424 A1 | 5/2002 | Miles |
| 2002/0070931 A1 | 6/2002 | Ishikawa |
| 2002/0075555 A1 | 6/2002 | Miles |
| 2002/0126364 A1 | 9/2002 | Miles |
| 2002/0146200 A1 | 10/2002 | Kurdle et al. |
| 2002/0149828 A1 | 10/2002 | Miles |
| 2002/0149834 A1 | 10/2002 | Mei et al. |
| 2002/0154422 A1 | 10/2002 | Sniegowski et al. |
| 2002/0197761 A1 | 12/2002 | Patel et al. |
| 2003/0011864 A1 | 1/2003 | Flanders |

| | | | | | |
|---|---|---|---|---|---|
| 2003/0016428 A1 | 1/2003 | Kato et al. | 2006/0220160 A1 | 10/2006 | Miles |
| 2003/0035196 A1 | 2/2003 | Walker | 2006/0262126 A1 | 11/2006 | Miles |
| 2003/0043157 A1 | 3/2003 | Miles | 2006/0262380 A1 | 11/2006 | Miles |
| 2003/0053078 A1 | 3/2003 | Missey et al. | 2006/0268388 A1 | 11/2006 | Miles |
| 2003/0072070 A1 | 4/2003 | Miles | 2006/0274398 A1 | 12/2006 | Chou |
| 2003/0119221 A1 | 6/2003 | Cunningham et al. | 2007/0020948 A1 | 1/2007 | Piehl et al. |
| 2003/0123125 A1 | 7/2003 | Little | 2007/0077525 A1 | 4/2007 | Davis et al. |
| 2003/0138669 A1 | 7/2003 | Kojima et al. | 2007/0086078 A1 | 4/2007 | Hagood et al. |
| 2003/0173504 A1 | 9/2003 | Cole et al. | 2007/0097694 A1 | 5/2007 | Faase et al. |
| 2003/0202265 A1 | 10/2003 | Reboa et al. | 2007/0121118 A1 | 5/2007 | Gally et al. |
| 2003/0202266 A1 | 10/2003 | Ring et al. | 2007/0138608 A1 | 6/2007 | Ikehashi |
| 2004/0008396 A1 | 1/2004 | Stappaerts | 2007/0153860 A1 | 7/2007 | Chang-Hasnain et al. |
| 2004/0008438 A1 | 1/2004 | Sato | 2007/0177247 A1 | 8/2007 | Miles |
| 2004/0027671 A1 | 2/2004 | Wu et al. | 2007/0194630 A1 | 8/2007 | Mingard et al. |
| 2004/0027701 A1 | 2/2004 | Ishikawa | 2007/0216987 A1 | 9/2007 | Hagood et al. |
| 2004/0043552 A1 | 3/2004 | Strumpell et al. | 2007/0253054 A1 | 11/2007 | Miles |
| 2004/0051929 A1 | 3/2004 | Sampsell et al. | 2007/0279729 A1 | 12/2007 | Kothari et al. |
| 2004/0058532 A1 | 3/2004 | Miles et al. | 2007/0279730 A1 | 12/2007 | Heald |
| 2004/0066477 A1 | 4/2004 | Morimoto et al. | 2007/0285761 A1 | 12/2007 | Zhong et al. |
| 2004/0075967 A1 | 4/2004 | Lynch et al. | 2008/0002299 A1 | 1/2008 | Thurn |
| 2004/0076802 A1 | 4/2004 | Tompkin et al. | 2008/0013144 A1 | 1/2008 | Chui et al. |
| 2004/0080035 A1 | 4/2004 | Delapierre | 2008/0013145 A1 | 1/2008 | Chui et al. |
| 2004/0100594 A1 | 5/2004 | Huibers et al. | 2008/0013154 A1 | 1/2008 | Chui |
| 2004/0100677 A1 | 5/2004 | Huibers et al. | 2008/0030657 A1 | 2/2008 | Wu et al. |
| 2004/0125281 A1 | 7/2004 | Lin et al. | 2008/0037093 A1 | 2/2008 | Miles |
| 2004/0125282 A1 | 7/2004 | Lin et al. | 2008/0055705 A1 | 3/2008 | Kothari |
| 2004/0145811 A1 | 7/2004 | Lin et al. | 2008/0055706 A1 | 3/2008 | Chui et al. |
| 2004/0147198 A1 | 7/2004 | Lin et al. | 2008/0055707 A1 | 3/2008 | Kogut et al. |
| 2004/0175577 A1 | 9/2004 | Lin et al. | 2008/0068697 A1 | 3/2008 | Haluzak et al. |
| 2004/0184134 A1 | 9/2004 | Makigaki | 2008/0080043 A1 | 4/2008 | Chui et al. |
| 2004/0188599 A1 | 9/2004 | Viktorovitch et al. | 2008/0088904 A1 | 4/2008 | Miles |
| 2004/0207897 A1 | 10/2004 | Lin | 2008/0088910 A1 | 4/2008 | Miles |
| 2004/0209195 A1 | 10/2004 | Lin | 2008/0088911 A1 | 4/2008 | Miles |
| 2004/0217264 A1 | 11/2004 | Wood et al. | 2008/0088912 A1 | 4/2008 | Miles |
| 2004/0217919 A1 | 11/2004 | Piehl et al. | 2008/0094690 A1 | 4/2008 | Luo et al. |
| 2004/0218251 A1 | 11/2004 | Piehl et al. | 2008/0106782 A1 | 5/2008 | Miles |
| 2004/0240032 A1 | 12/2004 | Miles | 2008/0110855 A1 | 5/2008 | Cummings |
| 2004/0259010 A1 | 12/2004 | Kanbe | 2008/0112035 A1 | 5/2008 | Cummings |
| 2005/0002082 A1 | 1/2005 | Miles | 2008/0112036 A1 | 5/2008 | Cummings |
| 2005/0003667 A1 | 1/2005 | Lin et al. | 2008/0158645 A1 | 7/2008 | Chiang |
| 2005/0024557 A1 | 2/2005 | Lin | 2008/0186581 A1 | 8/2008 | Bita et al. |
| 2005/0035699 A1 | 2/2005 | Tsai | 2008/0239455 A1 | 10/2008 | Kogut et al. |
| 2005/0036095 A1 | 2/2005 | Yeh et al. | 2008/0247028 A1 | 10/2008 | Chui et al. |
| 2005/0046919 A1 | 3/2005 | Taguchi et al. | 2008/0278787 A1 | 11/2008 | Sasagawa |
| 2005/0046922 A1 | 3/2005 | Lin et al. | 2008/0278788 A1 | 11/2008 | Sasagawa |
| 2005/0046948 A1 | 3/2005 | Lin | 2008/0297880 A1 | 12/2008 | Steckl et al. |
| 2005/0068627 A1 | 3/2005 | Nakamura et al. | 2008/0316566 A1 | 12/2008 | Lan |
| 2005/0078348 A1 | 4/2005 | Lin | 2008/0316568 A1 | 12/2008 | Griffiths et al. |
| 2005/0117190 A1 | 6/2005 | Iwauchi et al. | 2009/0009845 A1 | 1/2009 | Endisch et al. |
| 2005/0117623 A1 | 6/2005 | Shchukin et al. | 2009/0021884 A1 | 1/2009 | Nakamura |
| 2005/0128543 A1 | 6/2005 | Phillips et al. | 2009/0068781 A1 | 3/2009 | Tung et al. |
| 2005/0133761 A1 | 6/2005 | Thielemans | 2009/0073534 A1 | 3/2009 | Lee et al. |
| 2005/0168849 A1 | 8/2005 | Lin | 2009/0073539 A1 | 3/2009 | Mignard |
| 2005/0179378 A1 | 8/2005 | Oooka et al. | 2009/0078316 A1 | 3/2009 | Khazeni |
| 2005/0195462 A1 | 9/2005 | Lin | 2009/0080060 A1 | 3/2009 | Sampsell et al. |
| 2005/0249966 A1 | 11/2005 | Tung et al. | 2009/0101192 A1 | 4/2009 | Kothari et al. |
| 2005/0275930 A1 | 12/2005 | Patel et al. | 2009/0103166 A1 | 4/2009 | Khazeni et al. |
| 2006/0007517 A1 | 1/2006 | Tsai | 2009/0122384 A1 | 5/2009 | Felnhofer et al. |
| 2006/0017379 A1 | 1/2006 | Su et al. | 2009/0135465 A1 | 5/2009 | Chui |
| 2006/0017689 A1 | 1/2006 | Faase et al. | 2009/0147343 A1 | 6/2009 | Kogut et al. |
| 2006/0024880 A1 | 2/2006 | Chui et al. | 2009/0159123 A1 | 6/2009 | Kothari |
| 2006/0038643 A1 | 2/2006 | Xu et al. | 2009/0201566 A1 | 8/2009 | Kothari |
| 2006/0065940 A1 | 3/2006 | Kothari | 2009/0211885 A1 | 8/2009 | Steeneken et al. |
| 2006/0066599 A1 | 3/2006 | Chui | 2009/0213450 A1 | 8/2009 | Sampsell |
| 2006/0066640 A1 | 3/2006 | Kothari et al. | 2009/0213451 A1 | 8/2009 | Tung et al. |
| 2006/0066641 A1 | 3/2006 | Gally et al. | 2009/0256218 A1 | 10/2009 | Mignard et al. |
| 2006/0066936 A1 | 3/2006 | Chui et al. | 2009/0273823 A1 | 11/2009 | Tung et al. |
| 2006/0067649 A1 | 3/2006 | Tung et al. | 2009/0273824 A1 | 11/2009 | Sasagawa |
| 2006/0067651 A1 | 3/2006 | Chui | 2009/0279162 A1 | 11/2009 | Chui |
| 2006/0077152 A1 | 4/2006 | Chui et al. | 2009/0293955 A1 | 12/2009 | Kothari et al. |
| 2006/0077155 A1 | 4/2006 | Chui et al. | 2010/0039370 A1 | 2/2010 | Miles |
| 2006/0077156 A1 | 4/2006 | Chui et al. | 2010/0080890 A1 | 4/2010 | Tung et al. |
| 2006/0077507 A1 | 4/2006 | Chui et al. | 2010/0085626 A1 | 4/2010 | Tung et al. |
| 2006/0077516 A1 | 4/2006 | Kothari | 2010/0118382 A1 | 5/2010 | Kothari et al. |
| 2006/0079048 A1 | 4/2006 | Sampsell | 2010/0236624 A1 | 9/2010 | Khazeni et al. |
| 2006/0082588 A1 | 4/2006 | Mizuno et al. | 2010/0309572 A1 | 12/2010 | Mignard |
| 2006/0082863 A1 | 4/2006 | Piehl et al. | 2011/0019380 A1 | 1/2011 | Miles |
| 2006/0132927 A1 | 6/2006 | Yoon | 2011/0026095 A1 | 2/2011 | Kothari et al. |
| 2006/0180886 A1 | 8/2006 | Tsang | 2011/0026096 A1 | 2/2011 | Miles |

| | | | |
|---|---|---|---|
| 2011/0038027 | A1 | 2/2011 | Miles |
| 2011/0044496 | A1 | 2/2011 | Chui et al. |
| 2011/0069371 | A1 | 3/2011 | Kothari et al. |
| 2011/0080632 | A1 | 4/2011 | Miles |
| 2011/0116156 | A1 | 5/2011 | Kothari |
| 2011/0134505 | A1 | 6/2011 | Sasagawa |
| 2011/0170166 | A1 | 7/2011 | Miles |
| 2011/0170167 | A1 | 7/2011 | Miles |
| 2011/0170168 | A1 | 7/2011 | Endisch et al. |
| 2011/0188109 | A1 | 8/2011 | Chui et al. |
| 2011/0188110 | A1 | 8/2011 | Miles |

FOREIGN PATENT DOCUMENTS

| | | |
|---|---|---|
| EP | 0 035 299 | 9/1983 |
| EP | 0 668 490 | 8/1995 |
| EP | 0 695 959 | 2/1996 |
| EP | 0 879 991 | 11/1998 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 275 997 | 1/2003 |
| EP | 1 403 212 | 3/2004 |
| EP | 1 473 581 | 11/2004 |
| EP | 1 928 028 | 6/2008 |
| JP | 56-088111 | 7/1981 |
| JP | 5-49238 | 2/1993 |
| JP | 5-281479 | 10/1993 |
| JP | 08-051230 | 2/1996 |
| JP | 11211999 | 8/1999 |
| JP | 2002-062490 | 2/2000 |
| JP | 2000 147262 | 5/2000 |
| JP | 2001-221913 | 8/2001 |
| JP | 2001 249283 | 9/2001 |
| JP | 2002-221678 | 8/2002 |
| JP | 2003-340795 | 2/2003 |
| JP | 2003 177336 | 6/2003 |
| JP | 2004-012642 | 1/2004 |
| JP | 2004-212638 | 7/2004 |
| JP | 2004-212680 | 7/2004 |
| JP | 2005 279831 | 10/2005 |
| JP | 2005-308871 | 11/2005 |
| JP | 2007 027150 | 2/2007 |
| WO | WO 98/14804 | 4/1998 |
| WO | WO 98/43129 | 10/1998 |
| WO | WO 01/53113 | 7/2001 |
| WO | WO 02/24570 | 3/2002 |
| WO | WO 02/086582 | 10/2002 |
| WO | WO 03/105198 | 12/2003 |
| WO | WO 2006/035698 | 4/2006 |
| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO 2008/062363 | 5/2008 |

OTHER PUBLICATIONS

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.
Miles, Interferometric modulation: MOEMS as an enabling technology for high performance reflective displays, Proceedings of SPIE, vol. 4985, pp. 131-139, 2003.
ISR and WO dated Dec. 10, 2009 in PCT US/09/033818.
Billard, Tunable Capacitor, 5th Annual Review of LETI, Jun. 24, 2003, p. 7.
Hohlfeld et al., Jun. 2003, Micro-machined tunable optical filters with optimized band-pass spectrum, 12th International Conference on Transducers, Solid-State Sensors, Actuators and Microsystems, 2:1494-1497.
Mehregany et al., 1996, MEMS applications in optical systems, IEEE/LEOS 1996 Summer Topical Meetings, pp. 75-76.
Miles et al, Oct. 21, 1997, A MEMS based interferometric modulator (IMOD) for display applications, Proceedings of Sensors Expo, pp. 281-284.
Nieminen et al., 2004, Design of a temperature-stable RF MEM capacitor, IEEE Journal of Microelectromechanical Systems, 13(5):705-714.
Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.
Conner, "Hybrid Color Display Using Optical Interference Filter Array," SID Digest, pp. 577-580 (1993).
Feenstra et al., Electrowetting displays, Liquivista BV, 16 pp., Jan. 2006.
Jerman et al., "A Miniature Fabry-Perot Interferometer with a Corrugated Silicon Diaphragm Support", (1988).
Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.
Lezec, Submicrometer dimple array based interference color field displays and sensors, Nano Lett. 7(2):329-333, Dec. 23, 2006.
Miles, A New Reflective FPD Technology Using Interferometric Modulation, Journal of the SID, 5/4, 1997.
Taii et al., "A transparent sheet display by plastic MEMS," Journal of the SID 14(8):735-741, 2006.
IPRP dated Jul. 13, 2010 in PCT US/09/033818.
Longhurst, 1963, Chapter IX: Multiple Beam Interferometry, in Geometrical and Physical Optics, pp. 153-157.
Tolansky, 1948, Chapter II: Multiple-Beam Interference, in Multiple-bean Interferometry of Surfaces and Films, Oxford at the Clarendon Press, pp. 8-11.
Londergan et al., Advanced processes for MEMS-based displays, Proceedings of the Asia Display 2007, SID, 1:107-112.
Nakagawa et al., Feb. 1, 2002, Wide-field-of-view narrow-band spectral filters based on photonic crystal nanocavities, Optics Letters, 27(3):191-193.
Brosnihan et al., Jun. 2003, Optical IMEMS—a fabrication process for MEMS optical switches with integrated on-chip electronic, Transducers, Solid-State Sensors, Actuators and Microsystems, 12th International Conference 2003, 2(8-12):1638-1642.
Cacharelis et al., 1997, A Reflective-mode PDLC Light Valve Display Technology, Proceedings of European Solid State Device Research Conference (ESSDERC), pp. 596-599.
Dokmeci et al., Dec. 2004, Two-axis single-crystal silicon micromirror arrays, Journal of Microelectromechanical Systems, 13(6):1006-1017.
Maier et al., 1996, 1.3" active matrix liquid crystal spatial light modulator with 508 dpi resolution, SPIE vol. 2754, pp. 171-179.
Office Action dated Jul. 13, 2011 in Chinese App. No. 200980105948.0.

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

MICROELECTROMECHANICAL DEVICE WITH THERMAL EXPANSION BALANCING LAYER OR STIFFENING LAYER

BACKGROUND

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In certain embodiments, a device comprises an electrode, a fixed at least partial reflector, a movable flexible layer, a movable at least partial reflector coupled to the movable flexible layer. An interferometric modulating cavity is defined by the movable reflector and the fixed reflector. The movable reflector is movable between at least a first position and a second position. The device also comprises a thermal expansion balancing layer on a side of the movable flexible layer opposite the movable reflector. The thermal expansion balancing layer has a coefficient of thermal expansion greater than or equal to that of the movable flexible layer if a coefficient of thermal expansion of the movable reflector is greater than that of the movable flexible layer, or a coefficient of thermal expansion less than or equal to that of the movable flexible layer if the coefficient of thermal expansion of the movable reflector is less than that of the movable flexible layer.

In certain embodiments, a device comprises an electrode, a fixed at least partial reflector, a movable flexible element, a movable at least partial reflector, and a stiffening layer. The stiffening layer is coupled to the movable flexible element. There is at least one hollow void on at least one surface where the movable reflector and the stiffening layer contact each other. An interferometric modulating cavity is defined by the movable reflector and the fixed reflector.

In certain embodiments, a device comprises, a first means for reflecting light, a second means for reflecting light and a flexible means for moving. The second reflecting means is coupled to the means for moving. An interferometric modulating cavity is defined by the second reflecting means and the first reflecting means. The second reflecting means is movable between at least a first position and a second position. The device also comprises means for balancing thermal expansion, provided on a side of the means for moving opposite the second reflecting means. The means for balancing thermal expansion has a coefficient of thermal expansion greater than or equal to that of the means for moving if a coefficient of thermal expansion of the second reflecting means is greater than that of the means for moving, or a coefficient of thermal expansion less than or equal to that of the means for moving if the coefficient of thermal expansion of the second reflecting means is less than that of the means for moving.

In certain embodiments, a device comprises, a first means for reflecting light, a second means for reflecting light, means for operatively moving the second reflecting means, and means for stiffening the second reflecting means. The stiffening means is coupled to the means for moving. There is at least one hollow void on at least one surface where the second reflecting means and the stiffening means contact each other. An interferometric modulating cavity is defined by the second reflecting means and the first reflecting means.

In certain embodiments, a method of making a device for modulating light comprises: forming a first at least partial reflector, forming a movable flexible layer, forming a movable at least partial reflector coupled to the movable flexible layer. An interferometric modulating cavity is defined by the movable reflector and the first reflector. The movable reflector is movable between at least a first position and a second position. The method also comprises forming a thermal expansion balancing layer on a side of the movable flexible layer opposite the movable reflector. The thermal expansion balancing layer has a coefficient of thermal expansion greater than or equal to that of the movable flexible layer if a coefficient of thermal expansion of the movable reflector is greater than that of the movable flexible layer, or a coefficient of thermal expansion less than or equal to that of the movable flexible layer if the coefficient of thermal expansion of the movable reflector is less than that of the movable flexible layer.

In certain embodiments, a method of making a device for modulating light comprises forming a first at least partial reflector, forming a movable at least partial reflector, forming a stiffening layer, and forming a movable flexible element. The stiffening layer is coupled to the movable flexible element. There is at least one hollow void on at least one surface where the movable reflector and the stiffening layer contact each other. An interferometric modulating cavity is defined by the movable reflector and the first reflector.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One embodiment comprises an interferometric modulating device having a thermal expansion balancing layer on a side of the movable flexible layer opposite the movable at least partial reflector. This thermal expansion balancing layer has a coefficient of thermal expansion that is compatible to that of the movable reflector such that when temperature changes the distance between the movable reflector and the optical stack does not change significantly, thereby leading to stable color. Another embodiment comprises an interferometric modulating device having a stiffening layer between the movable flexible layer and the movable reflector and having at least one hollow void on the surface where the movable reflector and the stiffening layer contact each other. The stiffening layer and the hollow voids increase the stiffness of the movable reflector, and therefore make the movable reflector more rigid to bending, thereby reducing the temperature sensitivity of the movable reflector.

Figure 1:
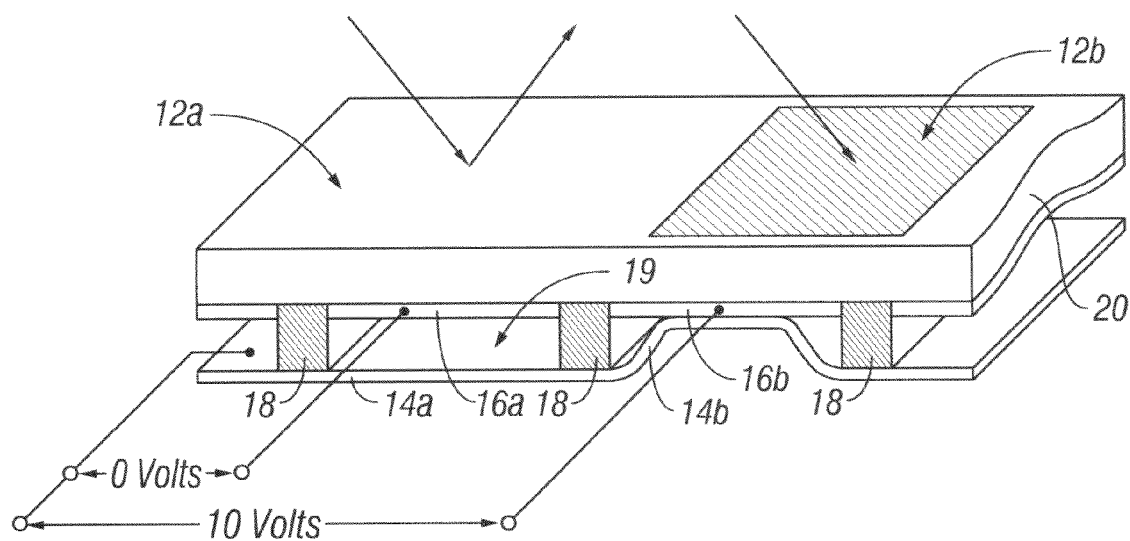
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
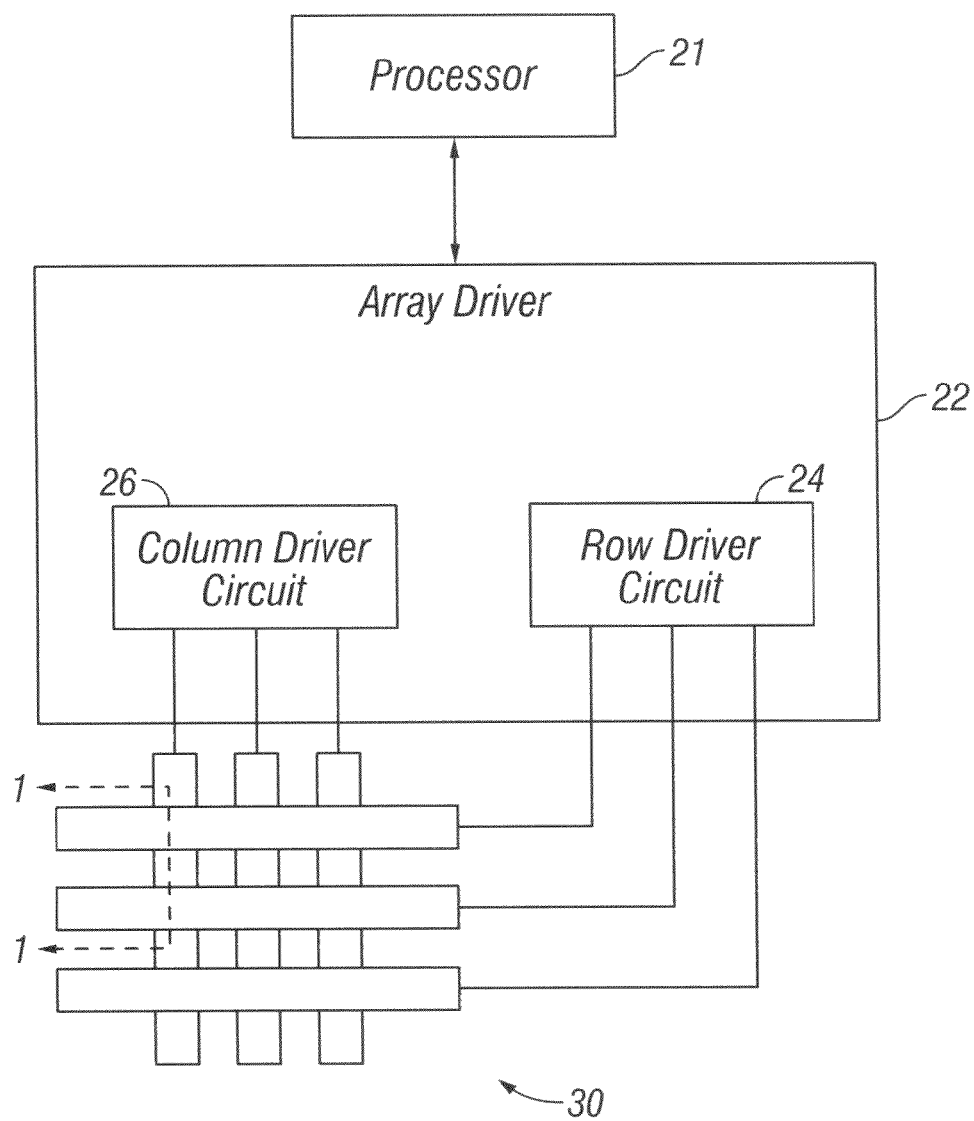
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
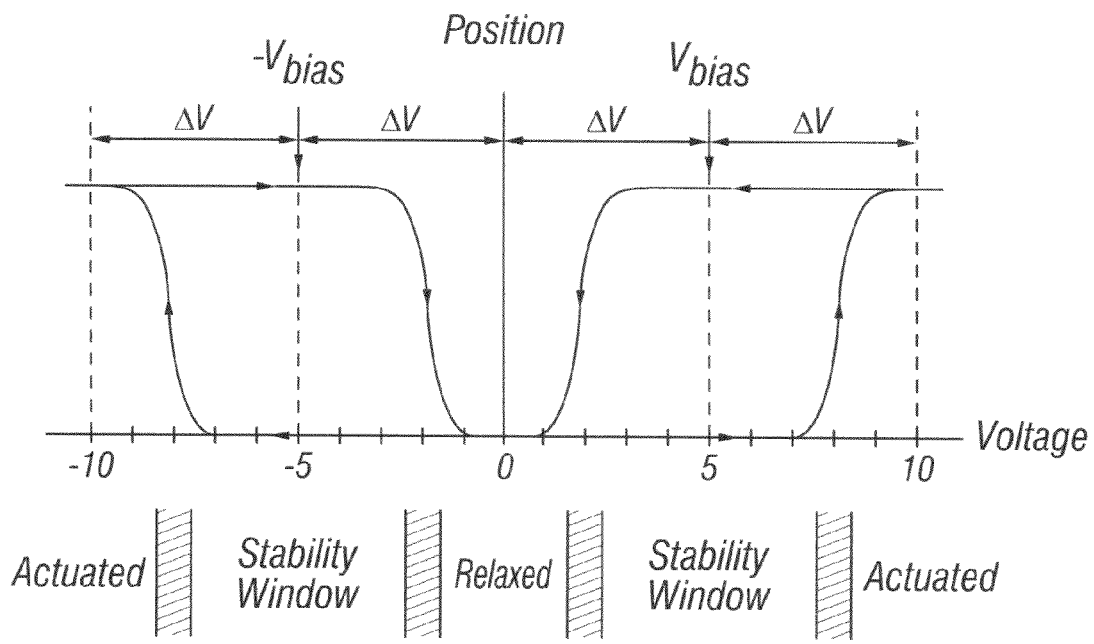
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
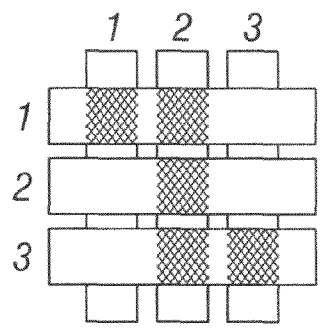
FIG. 5A illustrates one exemplary frame of display data in the 3×3 interferometric modulator display of FIG. 2.
Figure 5B:
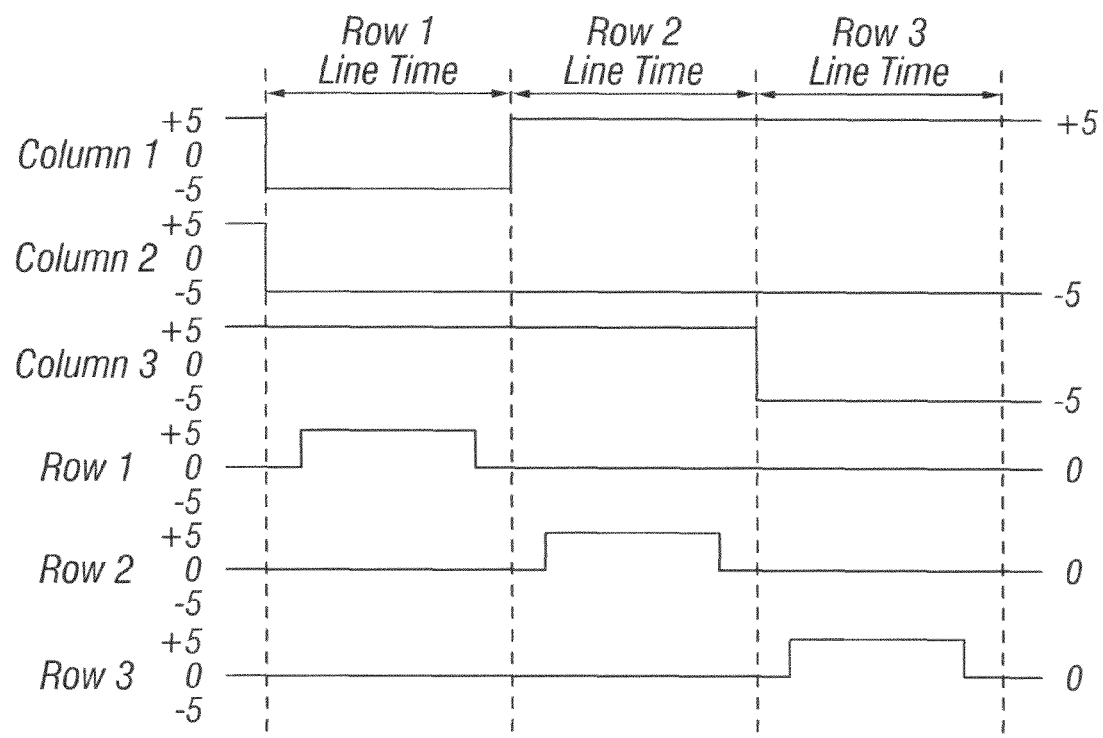
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
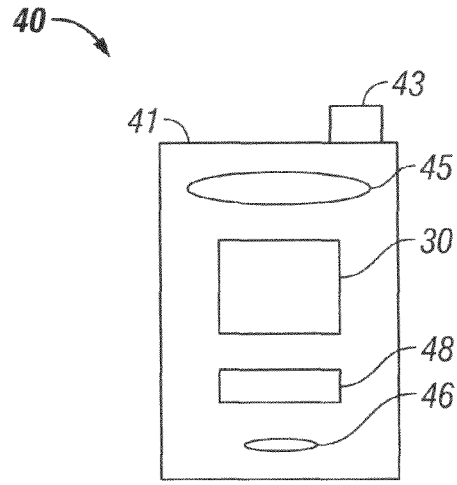
FIGS. 6A and 6B are system block diagrams illustrating an embodiment of a visual display device comprising a plurality of interferometric modulators.
Figure 6B:
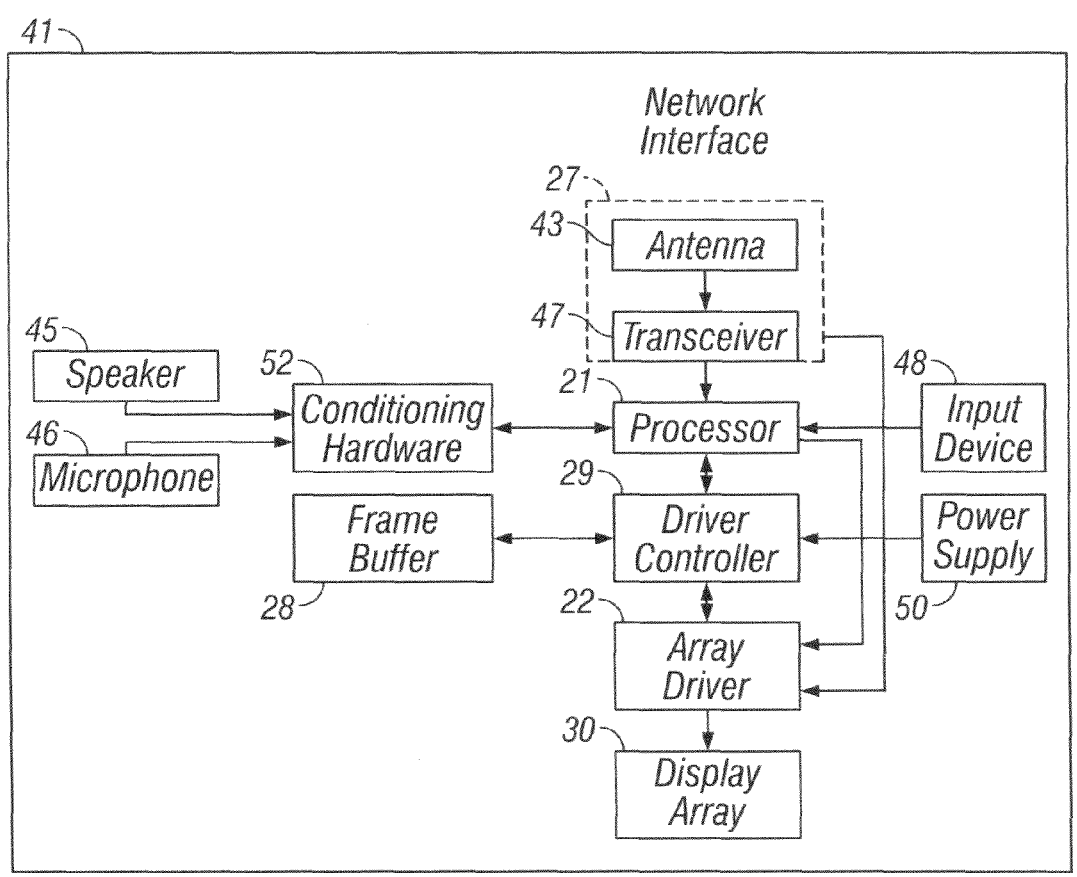

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47.

The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
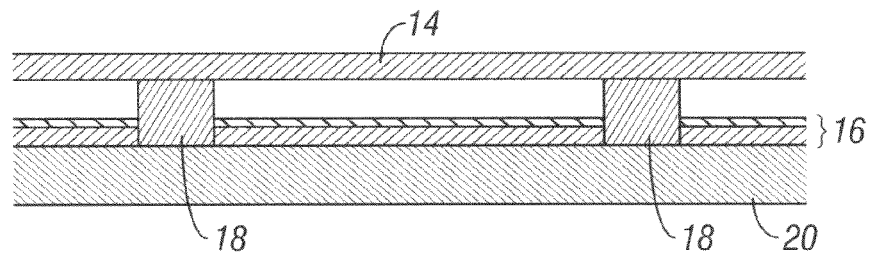
FIG. 7A is a cross section of the device of FIG. 1.
Figure 7B:
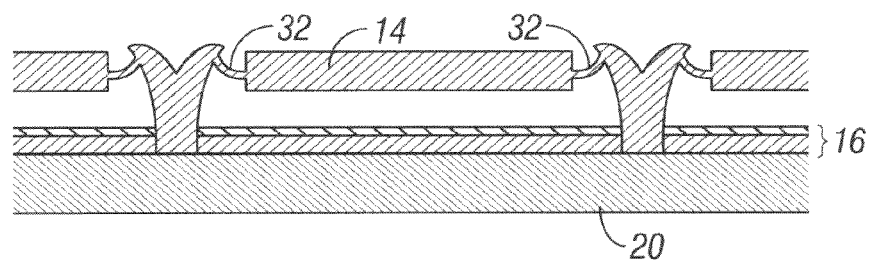
FIG. 7B is a cross section of an alternative embodiment of an interferometric modulator.
Figure 7C:
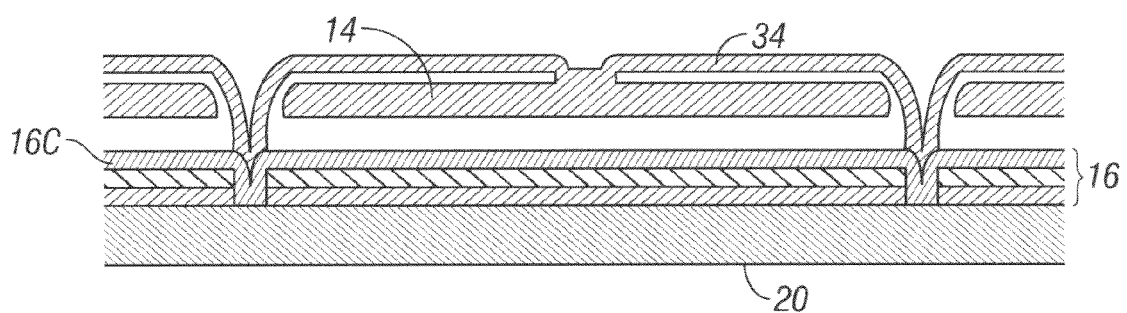
FIG. 7C is a cross section of another alternative embodiment of an interferometric modulator.
Figure 7D:
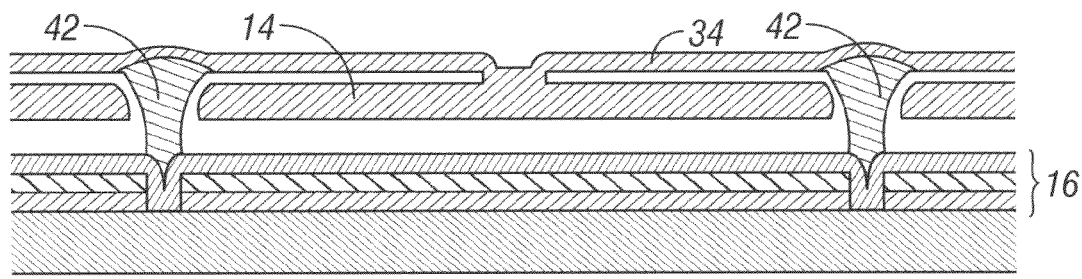
FIG. 7D is a cross section of yet another alternative embodiment of an interferometric modulator.
Figure 7E:
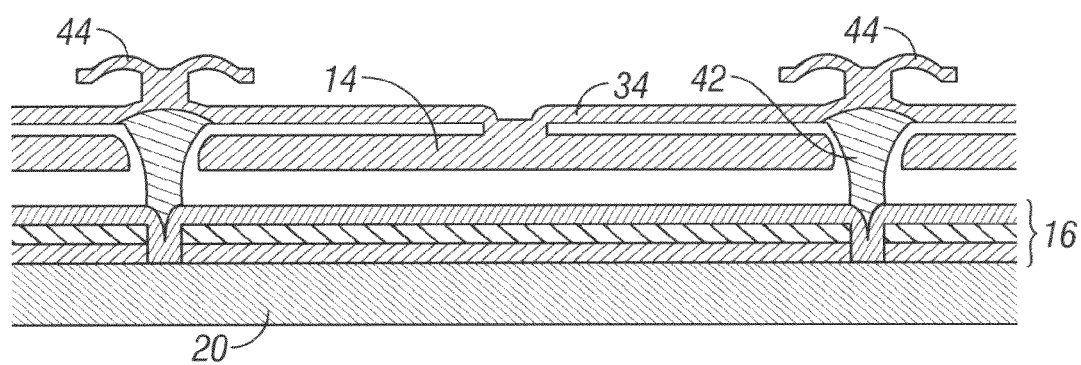
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
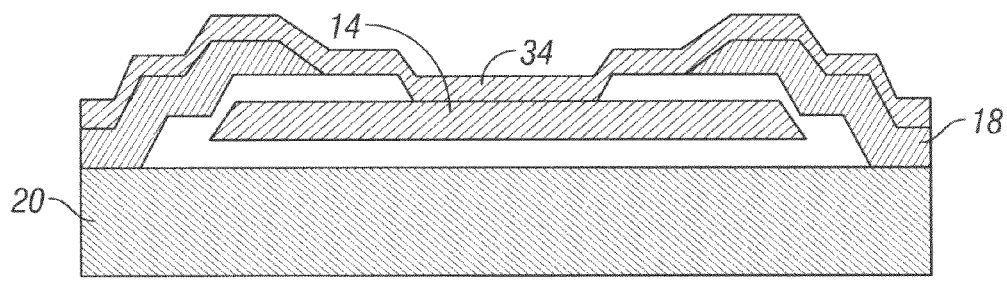
FIG. 8 is a cross section of still another example embodiment of an interferometric modulator.

FIG. 8 is a cross section of still another example embodiment of an interferometric modulator. In FIG. 8, like parts are numbered similarly with respect to previous figures. As is shown in FIG. 8, movable reflective layer 14, which is at least partially reflective, is coupled to the deformable layer (or "movable flexible layer") 34. In addition, for ease of illustration, the electrodes and the optical stack 16 have been omitted. As described above, the optical stack 16 comprises a fixed reflector, which is also at least partially reflective.

Optimization of the structural design and materials used for the movable reflector 14 and the movable flexible layer 34 may result in different materials being used for the movable reflector 14 and the movable flexible layer 34. Different materials may have different properties, such as residual stresses, which can cause curvature and/or tilt in the movable reflector 14. For example, the movable flexible layer 34 may be composed of thin film nickel with an intrinsic crystal lattice stress of about 350 megapascals (MPa) and the movable reflector 14 may be composed of thin film aluminum with an intrinsic crystal lattice stress of about 50 MPa. Because the residual stresses are different, an interface between nickel and aluminum will have a stress gradient, which will exert tensile or compressive forces, thereby causing a net displacement and/or curvature and/or tilt of the structure that is more pliable or compliant (e.g., the reflector as compared to the flexible layer). In addition, the interface between different materials with mismatched crystal lattices for the movable reflector 14 and the movable flexible layer 34, for example aluminum and nickel, respectively, can cause displacement and/or curvature and/or tilt of the movable reflector 14.

Another property that may be different between different materials is coefficient of thermal expansion. When a device comprising different materials for the movable reflector 14 and the movable flexible layer 34 is heated or cooled, thermal stresses due to different amounts of thermal expansion or contraction between the materials used for the movable reflector 14 and the movable flexible layer 34 can contribute to the curvature and/or tilt of the movable reflector 14. Thus, the magnitude of displacement and/or curvature and/or tilt in some embodiments is a function of temperature.

Net displacement, curvature or tilt of the movable reflector 14 may affect the size of the hysteresis window and the optical properties of the movable reflector 14. As described above, the row/actuation protocol may be set according to a hysteresis window, so a change in the hysteresis window may cause the device to function improperly or to fail.

Even if the device works within a given hysteresis window, the changed optical properties may adversely affect performance of a display comprising the device. In some embodiments, the surface of the movable reflector 14 facing the substrate 20 is substantially parallel to the optical stack 16, but curvature and/or tilt of the movable reflector 14 may cause some or all of the surfaces of the movable reflector 14 facing the substrate 20 to be non-parallel to the optical stack 16. In some other embodiments, the surface of the movable reflector 14 facing the substrate 20 is also substantially parallel to the optical stack 16, but due to a net displacement of the movable reflector 14, the movable reflector 14 may be deflected to a different distance from the optical stack 16, thus changing the color in the "up" state. Therefore, a displaced and/or curved and/or tilted movable reflector 14 may reflect differing amounts of visible light across its area, distorting whether the movable reflector 14 is in the "on" or "off" position and/or distorting the color of the modulator.

The mismatch between the coefficient of thermal expansion of a post 18 (e.g., comprising silicon dioxide ($SiO_2$)) and the deformable layer 34 (e.g., comprising nickel (Ni)) may also cause unstable color at certain operational temperatures. For example, $\alpha$-$SiO_2$ has a coefficient of thermal expansion of about $2.3 \times 10^{-6}$/K while nickel has a coefficient of thermal expansion of about $13 \times 10^{-6}$/K. When an interferometric modulator is heated or cooled, the stress difference between the deformable layer 34 and the posts 18 may cause a distance between the movable reflective portion 14 and the optical stack 16 to increase or decrease, thereby leading to unstable color as the temperature varies. Other coefficients of thermal expansion for appropriate materials include, but are not limited to, fused quartz-$SiO_2$ at about $0.5 \times 10^{-6}$/K, glass-$SiO_2$ (e.g., display glass from Corning) at about $3.7 \times 10^{-6}$/K, and silicon nitride ($SiN_x$, $Si_3N_4$, etc.) at about $4 \times 10^{-6}$/K.

Figure 9A:
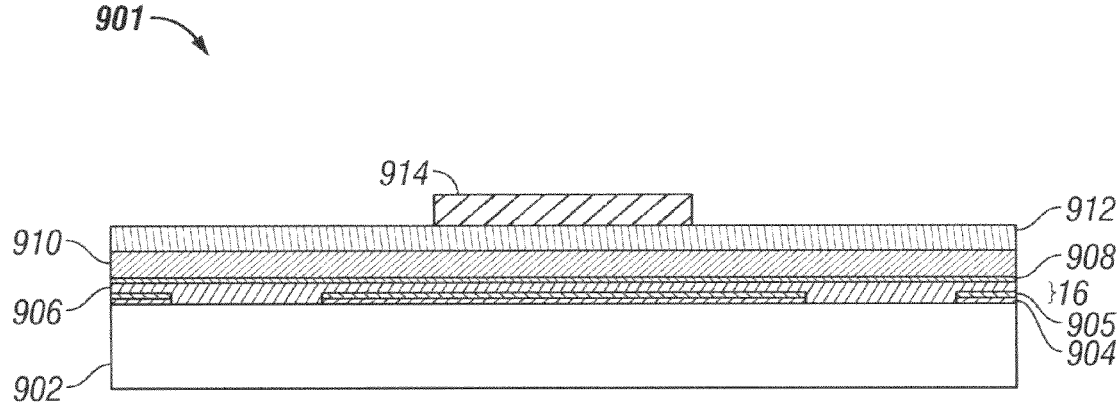
FIGS. 9A-9G schematically illustrate an example embodiment of a method of manufacturing the interferometric modulator as illustrated in FIG. 8.

FIGS. 9A-9G schematically illustrate an example embodiment of a method of manufacturing the interferometric modulator as illustrated in FIG. 8. FIG. 9A illustrates a structure 901 comprising a substrate 902 (e.g., comprising glass, plastic), an electrode 904 (e.g., comprising ITO), a first reflective layer (or "a fixed at least partial reflector") 905 (e.g., comprising chromium), an insulating layer 906 (e.g., comprising $SiO_2$), an oxide layer 908 (e.g., comprising $Al_2O_3$), a first sacrificial layer 910 (e.g., comprising molybdenum), and a reflective element 912 (e.g., comprising between about 2,000 and 20,000 Å of a reflective material such as aluminum, aluminum alloy, silver, silver alloy, etc.). A mask 914 (e.g., comprising photoresist) for patterning the reflective element 912 is formed over the reflective element 912.

Figure 9B:
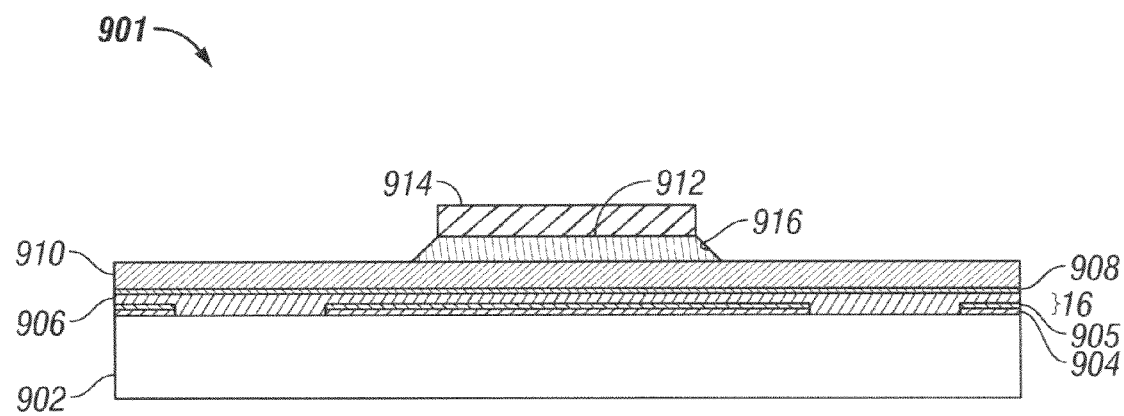

In FIG. 9B, the reflective element 912 has been patterned by etching. As an example, when the reflective element 912 comprises aluminum or aluminum alloys, $H_3PO_4$ plus acetic acid ($C_2H_4O_2$) (together "PA"), tetramethyl ammonium hydroxide (TMAH), potassium hydroxide (KOH), sodium hydroxide (NaOH), etc. may be used to selectively etch the reflective element 912 comprising aluminum, but to selectively not etch the first sacrificial layer 910 comprising molybdenum.

As illustrated in FIG. 9B, etching the reflective element 912 creates an edge of the reflective element 912. In certain embodiments, a taper angle 916 is created between the bottom of the reflective element 912 and the etched side of the reflective element 912. In some embodiments, control of this taper angle 916 aids in correct formation of the device 900. The taper angle 916 is between about 30° and 65° relative to the substrate 902 in some embodiments. Higher angles may be used, for example between 70° and 90°, but may result in poor step coverage for ensuing processes. Lower angles may be used, for example less than about 30°, but may result in small critical dimensions of the reflective element 912, which may be disadvantageous for embodiments in which the area of the reflective element 912 is large in order to increase fill factor. Other taper angles 916 may be suitable for certain processes (e.g., higher angles may be used for processes in which a subsequently deposited layer achieves good step coverage despite a high taper angle 916). In embodiments in which a wet etch is used to pattern the reflective element 912, the edge may be curved (e.g., shaped like the edge of a wineglass). Moreover, a wet etch will typically undercut the mask 914. By contrast, a dry etch generally results in straight tapered edges without an undercut of the mask 914 (e.g., as illustrated in FIG. 9B).

In certain embodiments, the deposition conditions of the reflective element 912 may be modified such that multiple layers with different properties are deposited. Such an embodiment may enable control of the taper angle 916 of the reflective element 912, for example providing different etch rates throughout its thickness (e.g., slow etch rates at the top of the reflective element 912 then faster etch rates at the bottom of the reflective element 912). Alternatively, the etch conditions may be modified during etching in order to change the profile of the edge of the reflective element 912 or to create a predetermined taper angle 916. In certain embodiments, both the deposition conditions and the etch conditions are modified. Other embodiments are also possible.

Figure 9C:
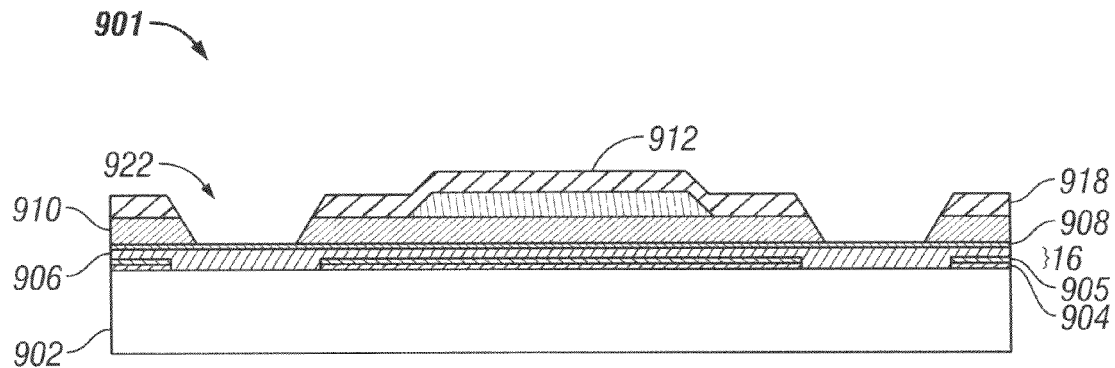

After forming the reflective element 912, the mask 914 is removed (e.g., by ashing or chemical strip in embodiments in which the mask 914 comprises photoresist). A second sacrificial layer 918 is then deposited. The second sacrificial layer 918 may comprise the same material as the first sacrificial material 910 or a different material than the first sacrificial material 910. For example, in some embodiments, the first and second sacrificial materials 910, 918 both comprise molybdenum. As illustrated in FIG. 9C, the first sacrificial layer 910 and the second sacrificial layer 918 are then patterned. In certain embodiments, the patterning of the first sacrificial layer 910 and the second sacrificial layer 918 are performed independently, although simultaneous patterning is may be performed. For example, in embodiments in which the first sacrificial layer 910 and the second sacrificial layer 918 both comprise molybdenum, an etch using sulfur hexafluoride ($SF_6$) plus oxygen ($O_2$), which is selective to aluminum and $Al_2O_3$, may be used. Other etchants comprising fluorine are also possible, but it will be appreciated that etchants such as $CF_4$ generally react slowly with molybdenum. Etchants comprising chlorine may be used but such etchants may not be sufficiently selective to aluminum and $Al_2O_3$. Alternatively, the second sacrificial layer 918 and the first sacrificial layer 910 may be patterned in series using different etchants, a series of different patterning masks, etc.

Figure 9D:
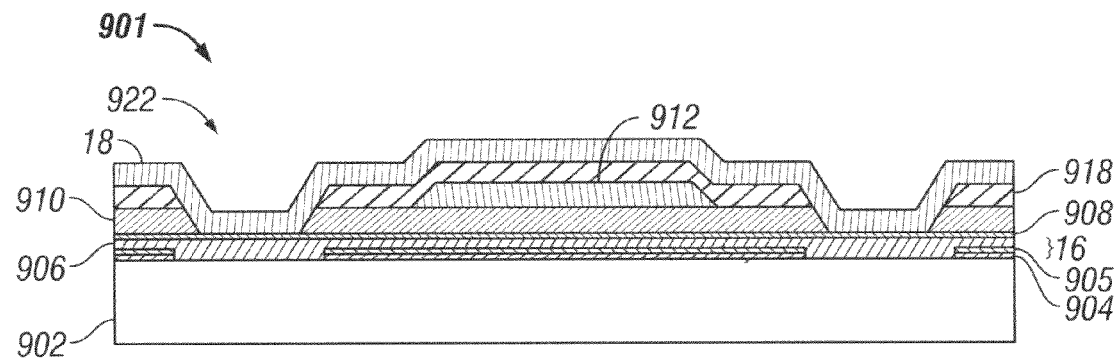
Figure 9E:
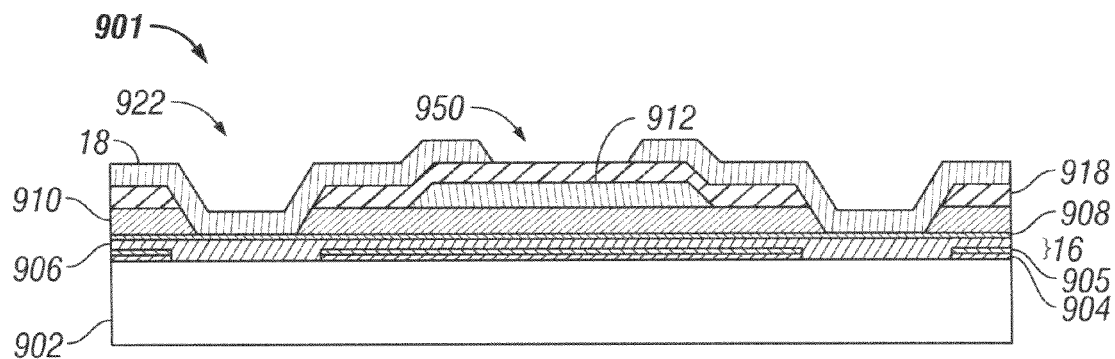
Figure 9F:
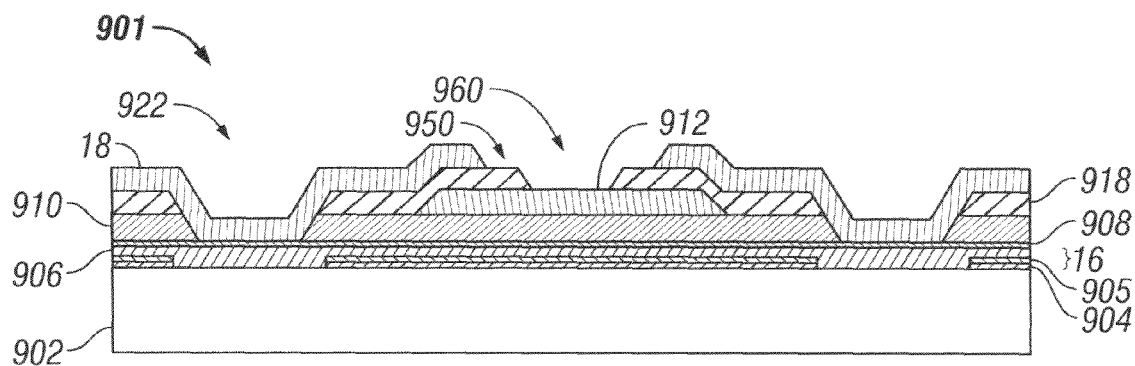
Figure 9G:
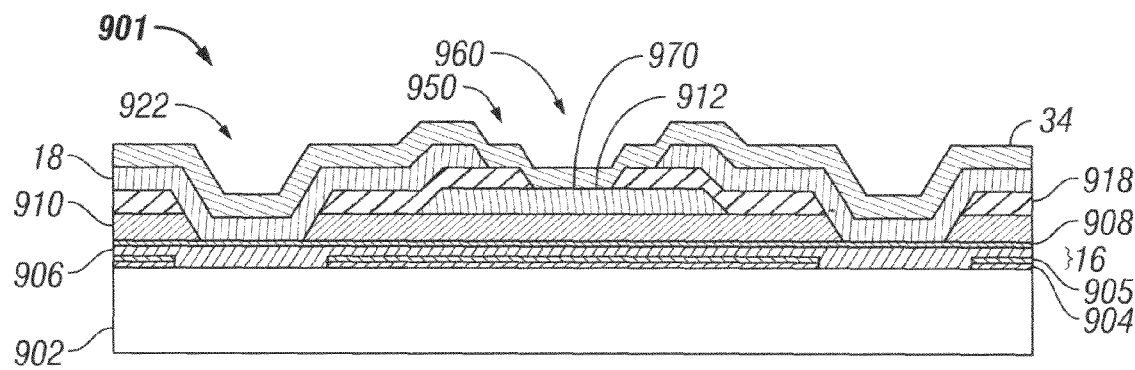

As illustrated in FIG. 9D, a dielectric layer 18 (e.g., comprising $SiO_2$) is then formed over the second sacrificial layer 918. Then, a portion of the dielectric layer 18 is etched away, as indicated by 950 in FIG. 9E, to expose the second sacrificial layer 918. Next, a portion of the exposed portion of the second sacrificial layer 918 is etched away, as indicated by 960 in FIG. 9F, to expose the reflective element 912. Afterwards, a deformable layer 34 (e.g., comprising nickel) is deposited on the dielectric layer 18, the exposed portion of the second sacrificial layer 918 and the exposed portion of the reflective element 912. The deformable layer 34 is mechanically coupled to the reflective element 912 at a portion 970 After the first sacrificial layer 910 and the second sacrificial layer 918 have been removed (e.g., by etching with $XeF_2$ in embodiments in which the first and the second sacrificial layers 910, 918 comprise molybdenum) from the structure 901 as illustrated in FIG. 9G, the interferometric modulator as illustrated in FIG. 8 is obtained.

As described above, the mismatch between the coefficient of thermal expansion of a post (e.g., comprising $SiO_2$) and a movable flexible layer (e.g., comprising nickel) may cause a color different from the intended target or unstable color at certain operational temperatures. Additionally, the mismatch between the coefficient of thermal expansion of a movable flexible layer (e.g., comprising $SiO_2$) and a movable at least partial reflector (e.g., comprising aluminum) may cause unstable color at certain operational temperatures. For example, $\alpha$-$SiO_2$ has a coefficient of thermal expansion of $2.3 \times 10^{16}$/K while aluminum has a coefficient of thermal expansion of about $25 \times 06$/K. When such a device is heated or cooled, the stress gradient between the movable flexible layer and the movable at least partial reflector may cause a distance between the movable at least partial reflector and the optical stack to increase or decrease, thereby leading to unstable color as the temperature varies.

Figure 10:
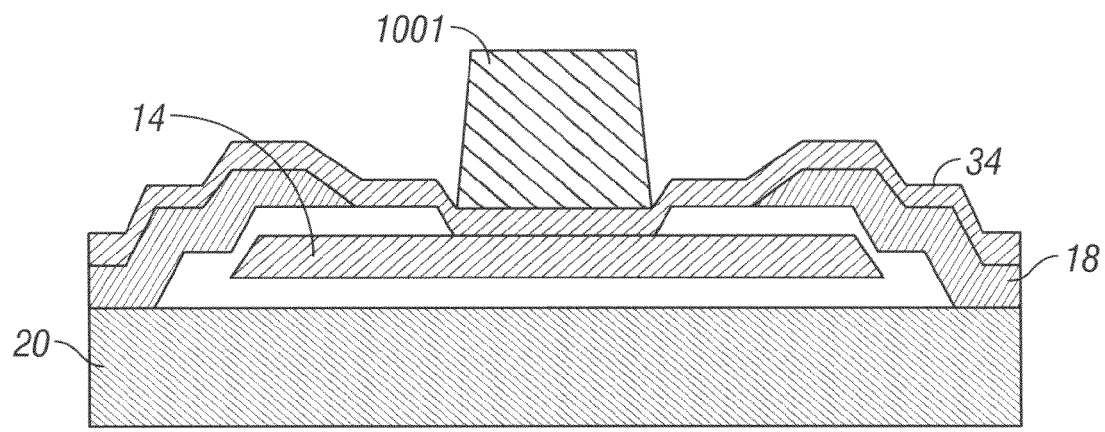
FIG. 10 illustrates a thermal expansion balancing layer that can be fabricated onto the interferometric modulator as illustrated in FIG. 8.

FIG. 10 illustrates a thermal expansion balancing layer 1001 that can be fabricated onto the interferometric modulator as illustrated in FIG. 8. The thermal expansion balancing layer 1001 is deposited on a side of the movable flexible layer 34 opposite the movable reflector 14. The coefficient of thermal expansion and the thickness of the thermal expansion balancing layer 1001 may be such that, when the interferometric modulator is heated or cooled, the stress gradient between the thermal expansion balancing layer 1001 and the movable flexible layer 34 and the stress gradient between the movable reflector 14 and the movable flexible layer 34 are substantially the same but in opposite directions. Therefore, the distance between the movable reflector 14 and the optical stack 16 does not change significantly, thereby leading to stable color as the temperature varies.

As described above, the material of the movable reflector 14 (e.g., comprising aluminum) may have a higher coefficient of thermal expansion than the movable flexible layer 34 (e.g., comprising $SiO_2$, or nickel). In such case, the thermal expansion balancing layer 1001 has a higher coefficient of thermal expansion than the movable flexible layer 34, and preferably higher than the movable reflector 14. One such material may be a polymer photoresist. The polymer photoresist however has a lower stiffness. Therefore, the thermal expansion balancing layer 1001 of the polymer photoresist may be several times thicker than the movable reflector 14.

Alternatively, the material of the movable reflector 14 may also have a lower coefficient of thermal expansion than the movable flexible layer 34. If so, the thermal expansion balancing layer 1001 may have a lower coefficient of thermal expansion than the movable flexible layer 34.

The thermal expansion balancing layer 1001 and the movable reflector 14 may also have a substantially the same coefficient of thermal expansion. For example, the thermal expansion balancing layer 1001 and the movable reflector 14 may comprise the same material. If so, the thermal expansion balancing layer 1001 may be substantially the same thickness as the movable reflector 14.

In addition, the thermal expansion balancing layer 1001 may also be patterned and etched so that the thermal expansion balancing layer 1001 contacts the movable flexible layer 34 on an opposite side of the movable flexible layer 34 only from about where the movable reflector 14 is coupled to the movable flexible layer 34.

Figure 11:
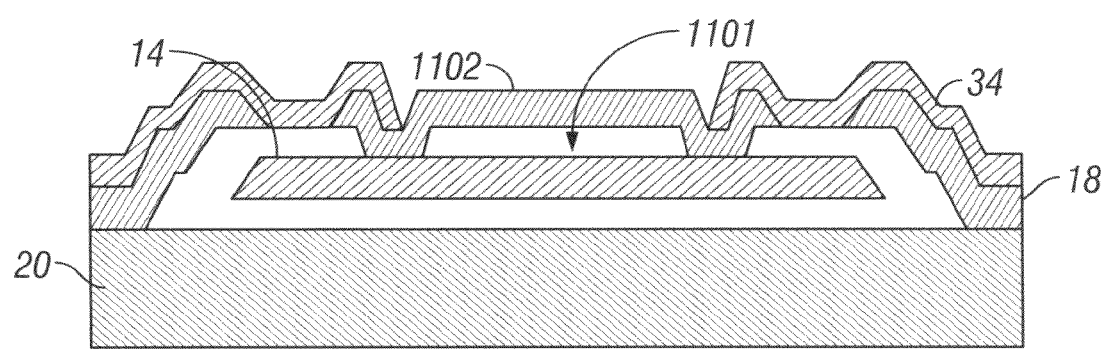
FIG. 11 is a cross section of still another example embodiment of an interferometric modulator.

FIG. 11 is a cross section of still another example embodiment of an interferometric modulator. In FIG. 11, like parts are numbered similarly with respect to previous figures. For ease of illustration, the electrodes and the optical stack 16 have been omitted. As described above, the optical stack 16 comprises a fixed reflector, which is also at least partially reflective. As shown in FIG. 11, the movable reflector 14, which is at least partially reflective, is not coupled to the movable flexible layer 34 directly, but through a stiffening layer 1102. There is at least one hollow void 1101 on at least one surface where the reflector 14 and the stiffening layer 1102 contact each other.

The coefficient of thermal expansion of the stiffening layer 1102 may be substantially the same as that of the movable reflector 14. However, even if the coefficient of thermal expansion of the movable reflector 14 may be higher than that of the stiffening layer 1102, the hollow voids 1101 between the movable reflector 14 and the stiffening layer 1102 may disproportionately increase the stiffness of the movable reflector 14, and therefore make the movable reflector 14 more rigid to bending, thereby reducing the temperature sensitivity of the movable reflector 14.

The production of an interferometric modulator device having a stiffening layer 1102 may require only slight amendments to the production of an interferometric modulator device that does not have the stiffening layer 1102, for example, as illustrated in FIGS. 9A-9G. In the example illustrated in FIG. 11, adding the stiffening layer 1102 may require the steps of depositing a sacrificial layer (not shown in FIG. 11) on top of the movable reflector 14, appropriately patterning the sacrificial layer on top of the movable reflector 14, depositing the stiffening layer 1102 so that the movable reflector 14 is coupled to the stiffening layer 1102, and depositing the movable flexible layer 34 on top of the post 18, the sacrificial layer, and the stiffening layer 1102.

In addition, the stiffening layer 1102 may be an integral part of the movable flexible layer 34. The hollow voids 1101 between the movable reflector 14 and movable flexible layer 34 may disproportionately increase the stiffness of the movable reflector 14, and therefore may make the movable reflector 14 more rigid to bending, thereby reducing the temperature sensitivity of the movable reflector 14. In such case, the production of the interferometric modulator device may be simplified by combining the step of depositing the stiffening layers 1102 and the step of depositing the movable flexible layer 34 into one step.

Figure 12A:
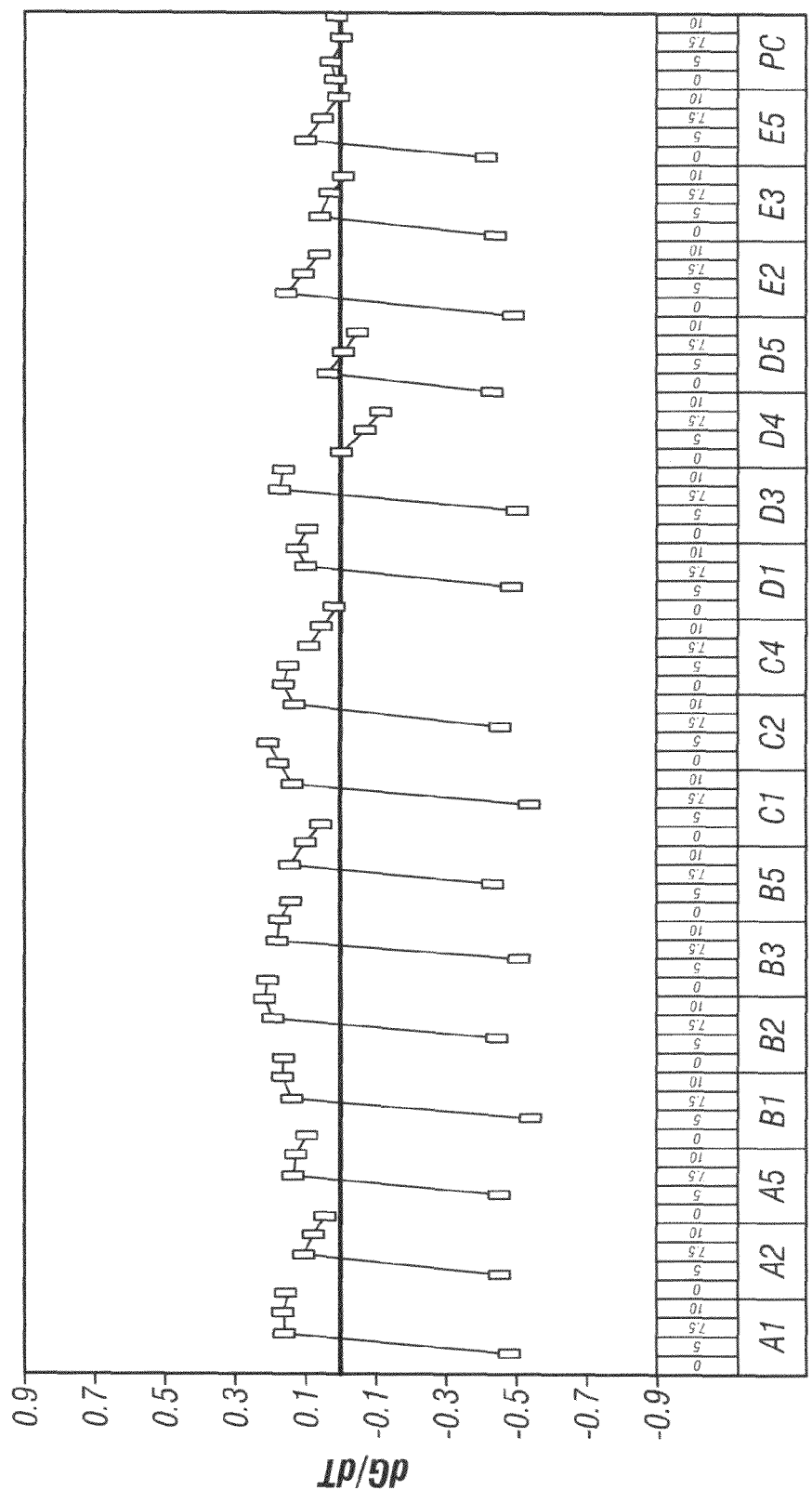
FIGS. 12A-12B show variability charts for example embodiments of interferometric modulators that have caps of different thicknesses.
Figure 12B:
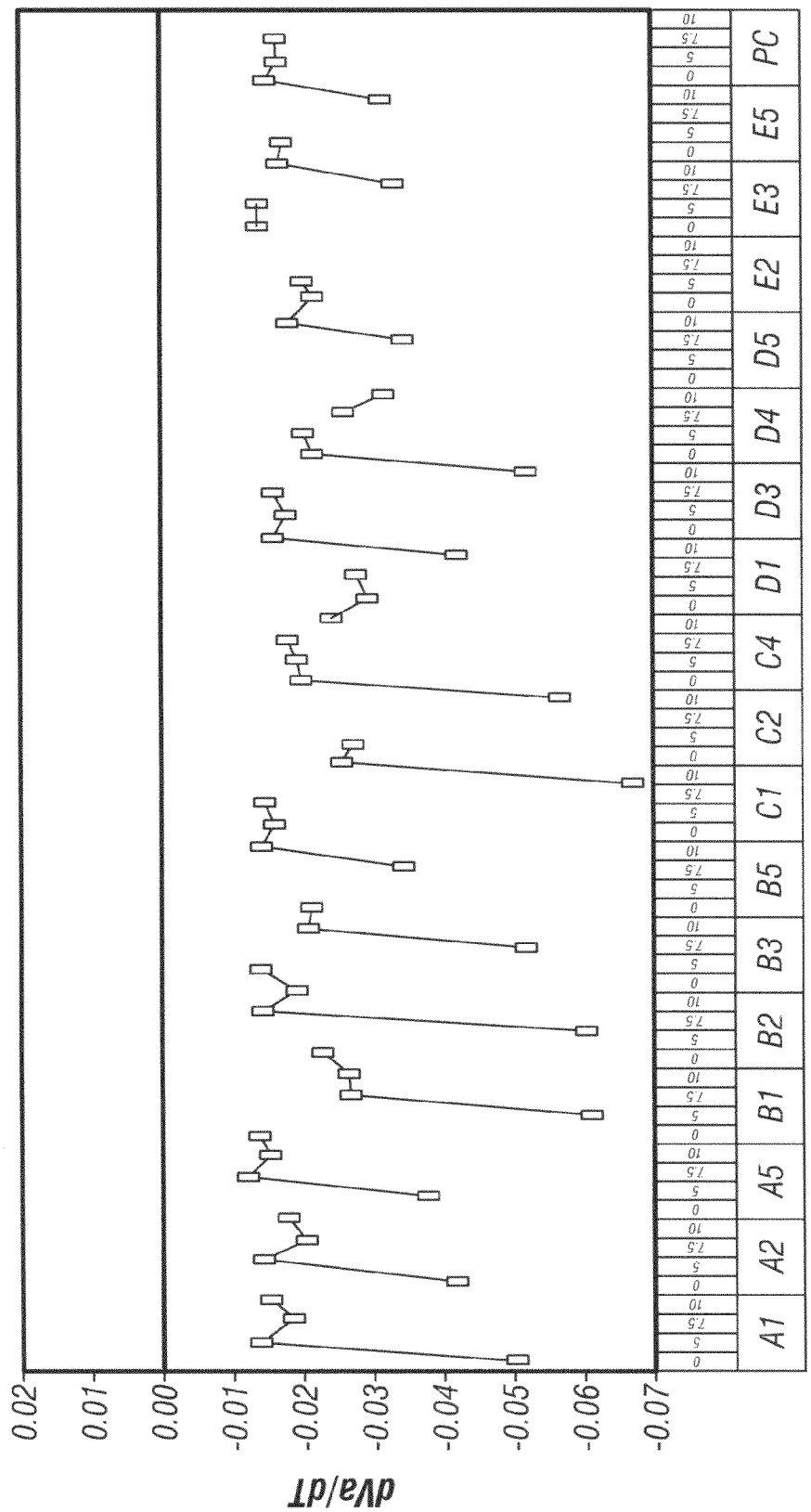

FIGS. 12A-12B show variability charts for example embodiments of interferometric modulators that have thermal expansion balancing layers (referred to alternatively as "caps" for brevity) of different thicknesses on different wafers. Each of different designs A1, A2, A5, B1, B2, . . . , and E5 is indicative of a type of design for an interferometric modulator on a wafer. Thus, FIGS. 12A-12B show the experimental results of 18 designs on 4 different wafers. Each wafer has different interferometric modulators having a selected cap thickness. The interferometric modulator in each design has the same structure as illustrated in FIG. 10, but the materials and/or thicknesses and/or pattern geometries of the layers are specifically modified so that the interferometric modulator reflects light of a specific color and operates at a specific actuation voltage. In FIG. 12A, all movable reflectors 14 in designs A1, A2, A5, B1, B2, . . . , and E5 have a thickness of 15,000 Å, and all posts 18 in these designs have a thickness of 15,000 Å. When the thickness of the thermal expansion balancing layer 1001 is zero (cap A1=0), the rate of change of average air gap in the interferometric modulating cavity with temperature, dG/dT, in these designs is between −0.6 to −0.4 Nanometers/Kelvin. Here, the air gap is the distance between the reflective surface of the movable reflector and the opposing surface of the dielectric oxide layer over the fixed reflector. When the thickness of the thermal expansion balancing layer 1001 is 5,000 Å, 7,500 Å, or 10,000 Å (respectively, A1 cap=5, 7.5, and 10 in FIG. 12A), however, the rate of change dG/dT becomes between −0.1 and 0.2 Nanometers/Kelvin. That is, the absolute value of the rate of change dG/dT is greatly reduced for designs that have a non-zero thickness for the thermal expansion balancing layer 1001. In some designs, for example, design D5, the rate of change dG/dT is even as low as zero when the thickness of the thermal expansion balancing layer 1001 is 7,500 Å.

In FIG. 12B, all movable reflectors 14 in designs A1, A2, A5, B1, B2, . . . , E5 have a thickness of 15,000 Å, and all posts 18 in these designs have a thickness of 15,000 Å. When the thickness of the thermal expansion balancing layer 1001 is zero, the rate of change of actuation voltage with temperature, dVa/dT, in these designs is between −0.07 to −0.03 Volts/Kelvin. When the thickness of the thermal expansion balancing layer 1001 is 5,000 Å, 7,500 Å, or 10,000 Å, however, the rate of change dVa/dT becomes between −0.03 and −0.01 Volts/Kelvin. That is, the absolute value of the rate of change dVa/dT is greatly reduced for designs that have the thermal expansion balancing layer 1001. In conclusion, FIGS. 12A-12B show the thermal expansion balancing layer 1001 reduces the effect of temperature on the interferometric modulators.

Figure 13A:
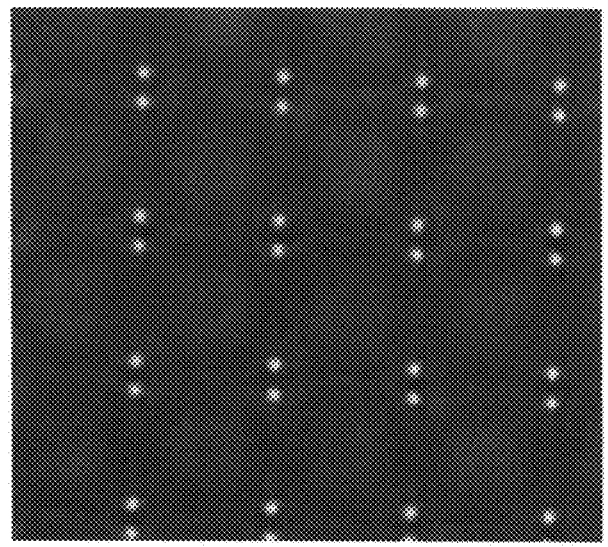
FIGS. 13A-13H show temperature sensitivity of example interferometric modulators that have caps of different thicknesses.
Figure 13B:
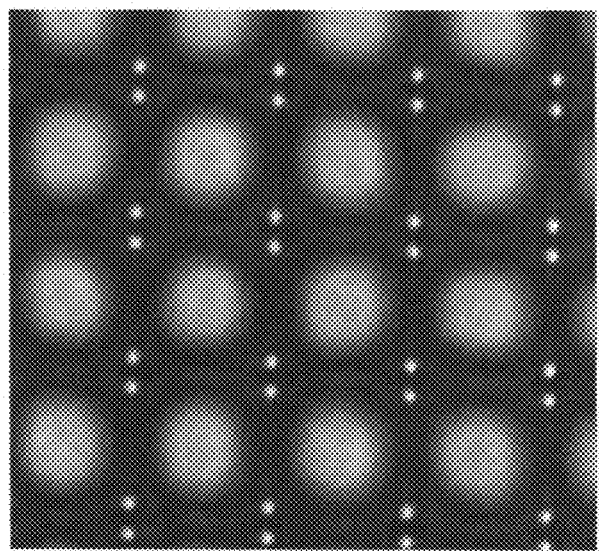
Figure 13C:
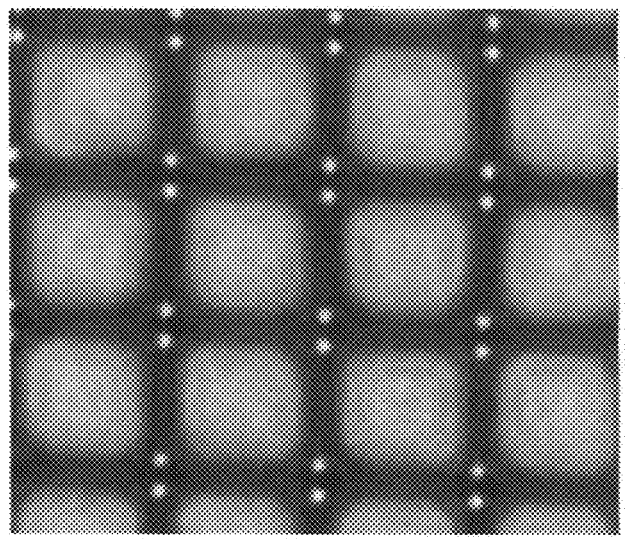
Figure 13D:
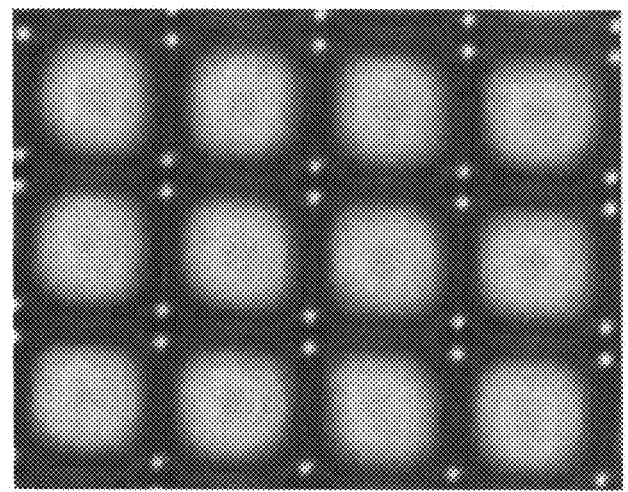
Figure 13E:
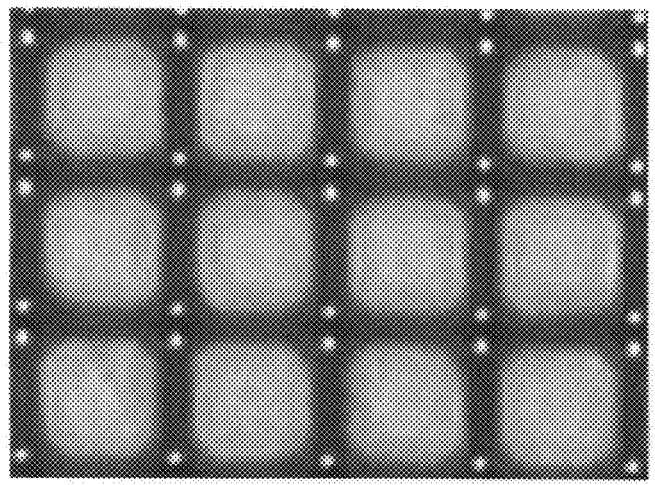
Figure 13F:
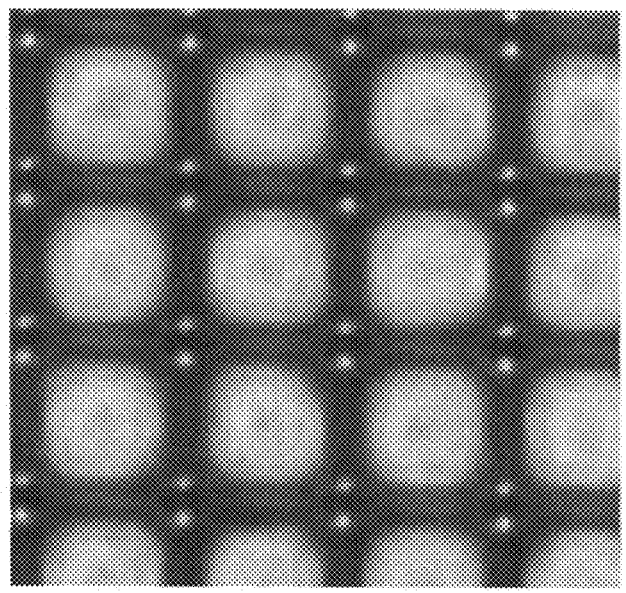
Figure 13G:
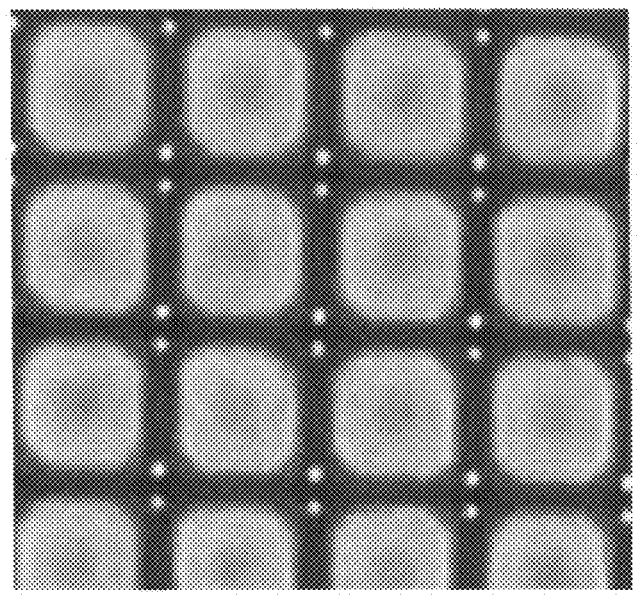
Figure 13H:
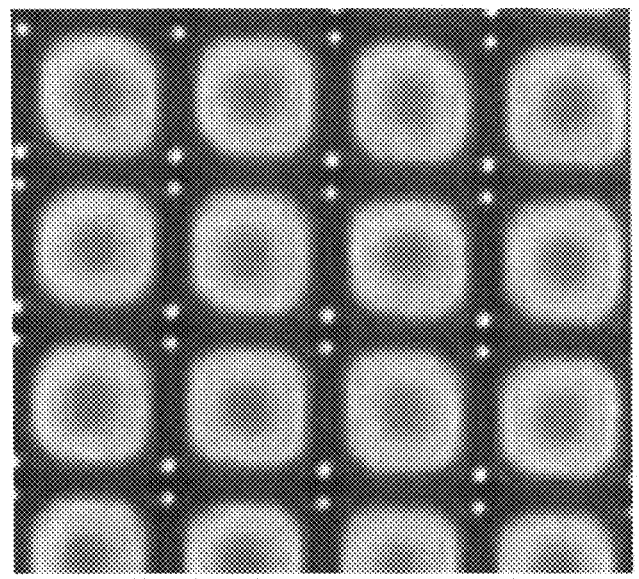

FIGS. 13A-13H show temperature sensitivity of example interferometric modulators that have caps of different thicknesses. FIGS. 13A and 13B show pictures of example interferometric modulators having no thermal expansion balancing layer (i.e., the cap has zero thickness) 1001 when the temperature is 20 degrees Celsius and 70 degrees Celsius respectively. FIGS. 13C and 13D show pictures of example interferometric modulators having 5,000 Å thick thermal expansion balancing layers 1001 when the temperature is 20 degrees Celsius and 70 degrees Celsius respectively. FIGS. 13E and 13F show pictures of example interferometric modulators having 7,500 Å thick thermal expansion balancing layers 1001 when the temperature is 20 degrees Celsius and 70 degrees Celsius respectively. FIGS. 13G and 13H show pictures of example interferometric modulators having 10,000 Å thick thermal expansion balancing layers 1001 when the temperature is 20 degrees Celsius and 70 degrees Celsius respectively. When the temperature changes from 20 degrees Celsius to 70 degrees Celsius, the pictures of example interferometric modulators having no thermal expansion balancing layer 1001 show significant change in optical performance, as illustrated in FIGS. 13A and 13B. However, when the temperature changes from 20 degrees Celsius to 70 degrees Celsius, the pictures of example interferometric modulators having thermal expansion balancing layers 1001 do not change as much, as shown in the reduced optical variation seen in FIGS. 13C through 13H. Therefore, example interferometric modulators having thermal expansion balancing layers 1001 show significantly more stable optical performance due to reflector displacement and/or curvature and/or tilt as temperature varies as compared to interferometric modulators without caps.

Figure 14A:
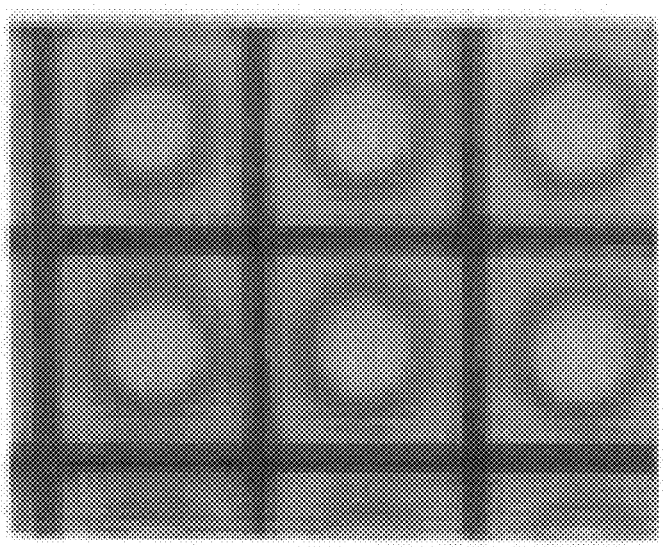
FIGS. 14A-14F show temperature sensitivity of example interferometric modulators that have stiffening layers and hollow voids.
Figure 14B:
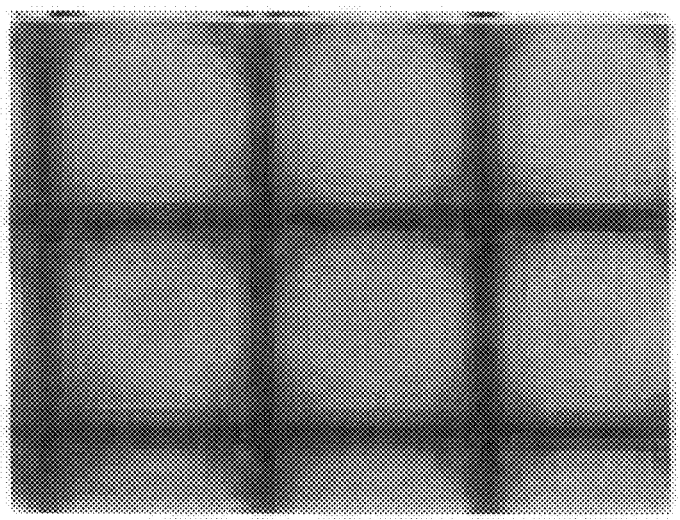
Figure 14C:
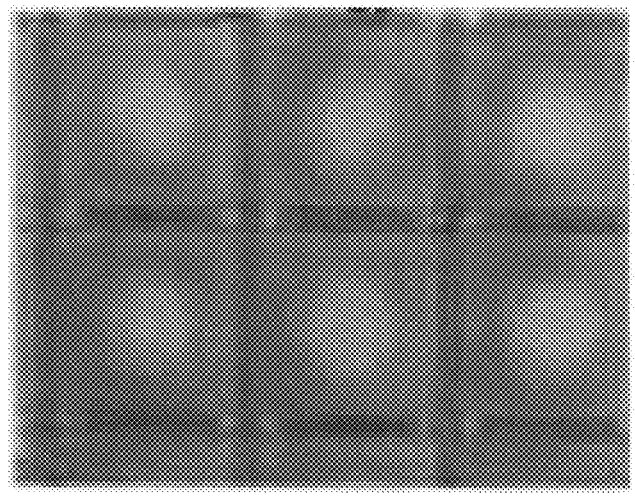
Figure 14D:
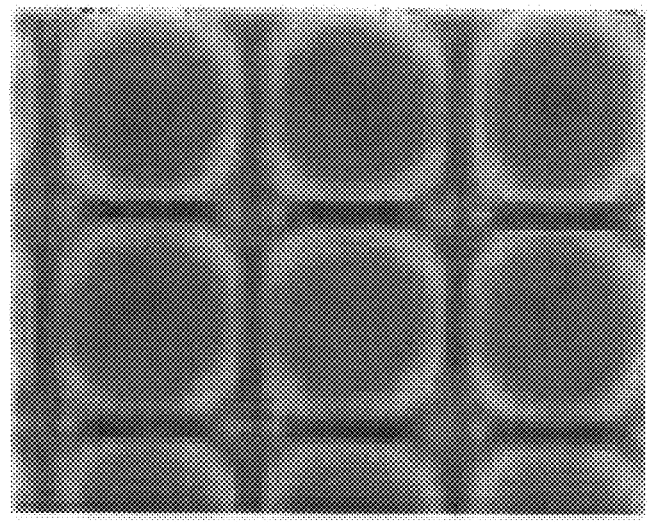
Figure 14E:
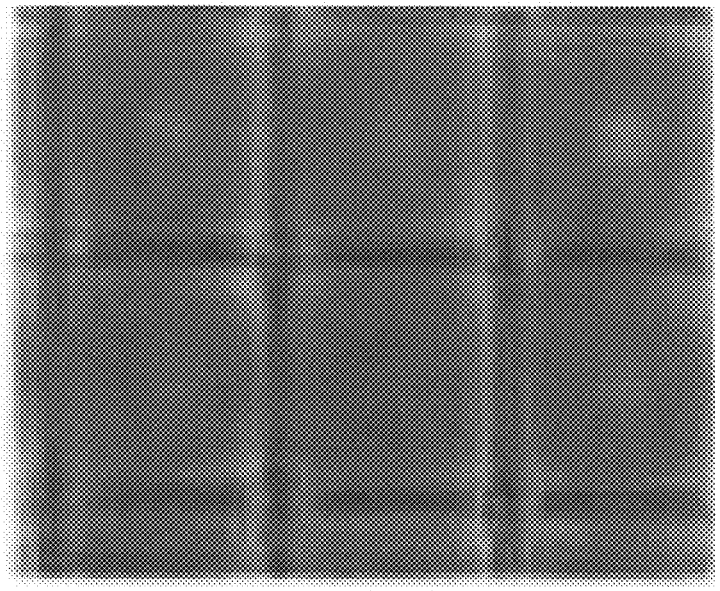
Figure 14F:
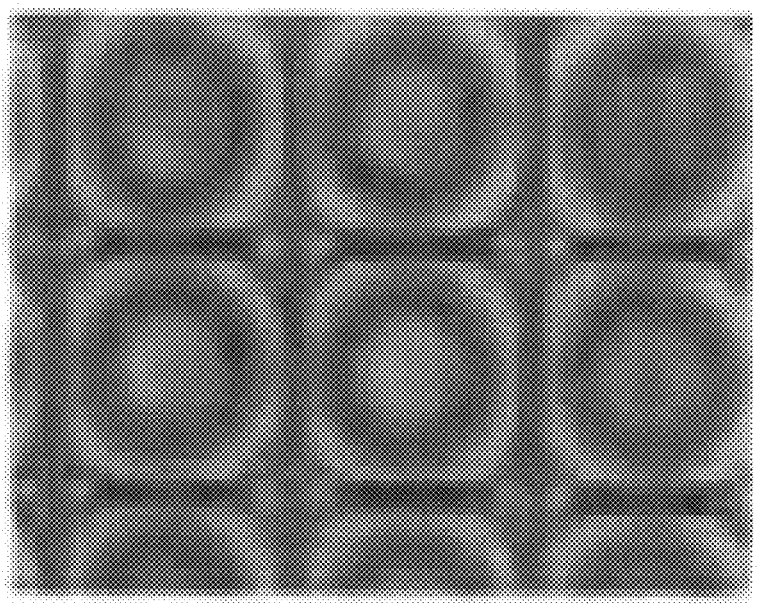

FIGS. 14A-14F show temperature sensitivity of example interferometric modulators that have stiffening layers and hollow voids of the form depicted in FIG. 11. FIGS. 14A and 14B show pictures of example interferometric modulators having no stiffening layer 1102 and no hollow void 1101 when the temperature is 20 degrees Celsius and 60 degrees Celsius respectively. FIGS. 14C and 14D show pictures of example interferometric modulators of one embodiment that have stiffening layers 1102 and hollow voids 1101 when the temperature is 20 degrees Celsius and 60 degrees Celsius respectively. FIGS. 14E and 14F show pictures of example interferometric modulators of another embodiment that have stiffening layers 1102 and hollow voids 1102 when the temperature is 20 degrees Celsius and 60 degrees Celsius respectively. Both the interferometric modulators in FIGS. 14C and 14D and the interferometric modulators in FIGS. 14E and 14F have the same structure as illustrated in FIG. 11. However, compared with the interferometric modulators in FIGS. 14C and 14D, the materials and/or thicknesses of the layers in the interferometric modulators in FIGS. 14E and 14F have been specifically modified so as to reflect light of a specific color and operate at a specific actuation voltage. When the temperature changes from 20 degrees Celsius to 60 degrees Celsius, the pictures of example interferometric modulators having no stiffening layer 1102 and hollow void 1101 show a significant change in optical performance in the interferometric modulators, as illustrated in FIGS. 14A and 14B. As shown in FIGS. 14C through 14F, however, the pictures of example interferometric modulators that have stiffening layers 1102 and hollow voids 1101 do not show a significant change in optical performance in the interferometric modulators when the temperature changes from 20 degrees Celsius to 60 degrees Celsius. Therefore, example interferometric modulators having stiffening layers 1102 and hollow voids 1101 show significantly more stable optical performance due to reflector displacement and/or curvature and/or tilt as temperature varies as compared to interferometric modulators without stiffening layers 1102 and hollow voids 1101.

As described above, in an interferometric modulating device, a thermal expansion balancing layer (cap) may be added on a side of the movable flexible layer opposite the movable reflector. This thermal expansion balancing layer may have a coefficient of thermal expansion that is compatible to that of the movable reflector such that when temperature changes the distance between the movable reflector and the optical stack does not change significantly, thereby leading to stable color over temperature. In addition, in an interferometric modulating device, a stiffening layer may be added between the movable flexible layer and the movable reflector, and at least one hollow void may exist on the surface where the movable reflector and the stiffening layer contact each other. The stiffening layer and the hollow void increase the stiffness of the movable reflector, and therefore make the movable reflector more rigid to bending, thereby reducing the temperature sensitivity of the interferometric modulating device.

Although this invention has been disclosed in the context of certain embodiments and examples, the present invention extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent. It is also contemplated that various combinations or sub-combinations of the specific features and aspects of the embodiments may be made. It should be understood that various features and aspects of the disclosed embodiments can be combined with, or substituted for, one another in order to form varying modes of the disclosed embodiments. Thus, it is intended that the scope of the present invention herein disclosed should not be limited by the particular disclosed embodiments described above, but should be determined only by the claims that follow.

What is claimed is:

1. A device comprising:
    an electrode;
    a fixed reflector which is at least partially reflective;
    a movable flexible layer;
    a movable reflector which is at least partially reflective, the movable reflector coupled to the movable flexible layer, wherein an interferometric modulating cavity is defined by the movable reflector and the fixed reflector, the movable reflector being movable between at least a first position and a second position; and
    a thermal expansion balancing layer on a side of the movable flexible layer opposite the movable reflector, wherein the thermal expansion balancing layer has a coefficient of thermal expansion greater than or equal to that of the movable flexible layer if a coefficient of thermal expansion of the movable reflector is greater than that of the movable flexible layer, or a coefficient of thermal expansion less than or equal to that of the movable flexible layer if the coefficient of thermal expansion of the movable reflector is less than that of the movable flexible layer.

2. The device of claim 1, wherein the thermal expansion balancing layer contacts the movable flexible layer on an opposite side of the movable flexible layer only from about where the movable reflector is coupled to the movable flexible layer.

3. The device of claim 1, wherein the thermal expansion balancing layer and the movable reflector have a substantially the same coefficient of thermal expansion.

4. The device of claim 3, wherein the thermal expansion balancing layer is substantially the same thickness as the movable reflector.

5. The device of claim 1, further comprising:
    a display;
    a processor that is configured to communicate with the display, the processor being configured to process image data; and
    a memory device that is configured to communicate with the processor.

6. The device of claim 5, further comprising a driver circuit configured to send at least one signal to the display.

7. The device of claim 6, further comprising a controller configured to send at least a portion of the image data to the driver circuit.

8. The device of claim 5, further comprising an image source module configured to send the image data to the processor.

9. The device of claim 8, wherein the image source module comprises at least one of a receiver, transceiver, and transmitter.

10. The device of claim 5, further comprising an input device configured to receive input data and to communicate the input data to the processor.

11. A device comprising:
    first means for reflecting light;
    second means for reflecting light, wherein an interferometric modulating cavity is defined by the second reflecting means and the first reflecting means, the second reflecting means being movable between at least a first position and a second position;
    means for moving the second reflecting means, the second reflecting means being coupled to the means for moving; and
    means for balancing thermal expansion, provided on a side of the means for moving opposite the second reflecting means, wherein the means for balancing thermal expansion has a coefficient of thermal expansion greater than or equal to that of the means for moving if a coefficient of thermal expansion of the second reflecting means is greater than that of the means for moving, or a coefficient of thermal expansion less than or equal to that of the means for moving if the coefficient of thermal expansion of the second reflecting means is less than that of the means for moving.

12. The device of claim 11, wherein the means for balancing thermal expansion contacts the means for moving on an opposite side of the means for moving only from about where the second reflecting means is coupled to the means for moving.

13. The device of claim 11, wherein the means for balancing thermal expansion and the second reflecting means have a substantially the same coefficient of thermal expansion.

14. The device of claim 13, wherein the means for balancing thermal expansion is substantially the same thickness as the second reflecting means.

15. A method of making a device for modulating light, the method comprising:
    forming a fixed reflector which is at least partially reflective;
    forming a movable flexible layer;
    forming a movable reflector which is at least partially reflective, the movable reflector coupled to the movable flexible layer, wherein an interferometric modulating cavity is defined by the movable reflector and the fixed reflector, the movable reflector being movable between at least a first position and a second position; and
    forming a thermal expansion balancing layer on a side of the movable flexible layer opposite the movable reflector, wherein the thermal expansion balancing layer has a coefficient of thermal expansion greater than or equal to that of the movable flexible layer if a coefficient of thermal expansion of the movable reflector is greater than that of the movable flexible layer, or a coefficient of thermal expansion less than or equal to that of the movable flexible layer if the coefficient of thermal expansion of the movable reflector is less than that of the movable flexible layer.

16. The method of claim 15, wherein the thermal expansion balancing layer contacts the movable flexible layer on an opposite side of the movable flexible layer only from about where the movable reflector is coupled to the movable flexible layer.

17. The device of claim 15, wherein the thermal expansion balancing layer and the movable reflector have a substantially the same coefficient of thermal expansion.

18. The device of claim 17, wherein the thermal expansion balancing layer is substantially the same thickness as the movable reflector.

* * * * *

UNITED STATES PATENT AND TRADEMARK OFFICE
CERTIFICATE OF CORRECTION

PATENT NO. : 8,164,821 B2
APPLICATION NO. : 12/072090
DATED : April 24, 2012
INVENTOR(S) : Gudlavalleti et al.

It is certified that error appears in the above-identified patent and that said Letters Patent is hereby corrected as shown below:

(Item 56) Page 4, Column 2, Line 22, change "Liquivista" to --Liquavista--.

Column 13, Line 33, change "$2.3\times10^{16}/K$" to --$2.3\times10^{-6}/K$--.

Column 6, Line 58, change "$25\times06/K.$" to --$25\times10^{-6}/K.$--.

Claim 4, Column 17, Line 53, change "is" to --has--.

Claim 14, Column 18, Line 45, change "is" to --has--.

Claim 18, Column 20, Line 6, change "is" to --has--.

Signed and Sealed this
Ninth Day of October, 2012

David J. Kappos
*Director of the United States Patent and Trademark Office*